United States Patent
Li et al.

(10) Patent No.: US 10,231,344 B2
(45) Date of Patent: Mar. 12, 2019

(54) METALLIC INK

(75) Inventors: Yunjun Li, Austin, TX (US); David Max Roundhill, Austin, TX (US); Mohshi Yang, Austin, TX (US); Igor Pavlovsky, Cedar Park, TX (US); Richard Lee Fink, Austin, TX (US); Zvi Yaniv, Austin, TX (US)

(73) Assignees: APPLIED NANOTECH HOLDINGS, INC., Austin, TX (US); ISHIHARA CHEMICAL CO., LTD., Hyogo (JP)

( * ) Notice: Subject to any disclaimer, the term of this patent is extended or adjusted under 35 U.S.C. 154(b) by 1678 days.

(21) Appl. No.: 12/121,260

(22) Filed: May 15, 2008

(65) Prior Publication Data

US 2008/0286488 A1 Nov. 20, 2008

Related U.S. Application Data

(60) Provisional application No. 60/938,975, filed on May 18, 2007.

(51) Int. Cl.
| | |
|---|---|
| *B05D 3/06* | (2006.01) |
| *H05K 3/02* | (2006.01) |
| *C23C 18/14* | (2006.01) |
| *B22F 1/00* | (2006.01) |
| *B22F 1/02* | (2006.01) |

(Continued)

(52) U.S. Cl.
CPC ............ *H05K 3/02* (2013.01); *B22F 1/0074* (2013.01); *B22F 1/025* (2013.01); *C22C 47/04* (2013.01); *C23C 18/14* (2013.01); *H01B 1/026* (2013.01); *B22F 2999/00* (2013.01); *H05K 1/0393* (2013.01); *H05K 2201/0257* (2013.01); *H05K 2203/0514* (2013.01);
(Continued)

(58) Field of Classification Search
CPC .... B22F 1/0007; B22F 7/008; B22F 2003/10; B22F 2007/02; B22F 2201/10; B22F 2999/00
See application file for complete search history.

(56) References Cited

U.S. PATENT DOCUMENTS

| | | |
|---|---|---|
| 3,239,597 A | 3/1966 | Flynn |
| 3,580,731 A | 5/1971 | Milewski et al. |

(Continued)

FOREIGN PATENT DOCUMENTS

| | | |
|---|---|---|
| CN | 1509206 A | 6/2004 |
| CN | 1803940 | 7/2006 |

(Continued)

OTHER PUBLICATIONS

Francisco Delogu; "Structural and energetic properties of unsupported Cu nanoparticles from room temperature to melting point: Molecular dynamics simulations"; Physical Review B 72, pp. 250418-1 to 205418-9; Nov. 11, 2005.*

(Continued)

*Primary Examiner* — Marianne L Padgett
(74) *Attorney, Agent, or Firm* — Matheson Keys & Kordzik PLLC; Kelly Kordzik

(57) ABSTRACT

Forming a conductive film comprising depositing a non-conductive film on a surface of a substrate, wherein the film contains a plurality of copper nanoparticles and exposing at least a portion of the film to light to make the exposed portion conductive. Exposing of the film to light photosinters or fuses the copper nanoparticles.

5 Claims, 21 Drawing Sheets

(51) Int. Cl.
*C22C 47/04* (2006.01)
*H01B 1/02* (2006.01)
*H05K 1/03* (2006.01)

(52) U.S. Cl.
CPC ............... H05K 2203/107 (2013.01); H05K 2203/1131 (2013.01); H05K 2203/1545 (2013.01)

(56) References Cited

U.S. PATENT DOCUMENTS

| | | | |
|---|---|---|---|
| 3,796,598 A | 3/1974 | Gejyo et al. | |
| 3,950,605 A | 4/1976 | Hori et al. | |
| 4,093,466 A | 6/1978 | Davis | |
| 4,151,008 A | 4/1979 | Kirkpatrick | |
| 4,194,913 A | 3/1980 | Davis | |
| RE30,434 E | 11/1980 | Davis | |
| 4,234,631 A | 11/1980 | Davis | |
| 4,331,518 A | 5/1982 | Wilson | |
| 4,591,951 A | 5/1986 | Iwamoto et al. | |
| 4,640,746 A | 2/1987 | Nobel et al. | |
| 4,681,670 A | 7/1987 | Nobel et al. | |
| 4,749,626 A | 6/1988 | Kadija et al. | |
| 4,756,791 A | 7/1988 | D'Angelo et al. | |
| 4,922,322 A | 5/1990 | Mathew | |
| 4,935,312 A | 6/1990 | Nakayama et al. | |
| 4,959,278 A | 9/1990 | Shimauch et al. | |
| 4,997,516 A | 3/1991 | Adler | |
| 4,997,722 A | 3/1991 | Adler | |
| 5,008,997 A | 4/1991 | Phy | |
| 5,039,576 A | 8/1991 | Wilson | |
| 5,049,718 A | 9/1991 | Spletter et al. | |
| 5,130,275 A | 7/1992 | Dion | |
| 5,160,422 A | 11/1992 | Nishimura et al. | |
| 5,202,179 A | 4/1993 | Kasahara | |
| 5,234,513 A | 8/1993 | Inoue et al. | |
| 5,260,849 A | 11/1993 | Kasahara | |
| 5,277,756 A | 1/1994 | Dion | |
| 5,320,737 A | 6/1994 | Chao et al. | |
| 5,322,823 A | 6/1994 | Ueda et al. | |
| 5,384,204 A | 1/1995 | Yumoto et al. | |
| 5,393,573 A | 2/1995 | MacKay | |
| 5,439,639 A | 8/1995 | Vianco et al. | |
| 5,492,595 A | 2/1996 | Carano et al. | |
| 5,698,087 A | 12/1997 | Bokisa | |
| 5,724,727 A | 3/1998 | Chopra et al. | |
| 5,730,851 A | 3/1998 | Arrowsmith et al. | |
| 5,750,017 A | 5/1998 | Zhang | |
| 5,798,286 A | 8/1998 | Faraci et al. | |
| 5,861,076 A | 1/1999 | Adlam | |
| 5,879,568 A | 3/1999 | Urasaki et al. | |
| 5,889,083 A | 3/1999 | Zhu et al. | |
| 5,897,519 A | 4/1999 | Suzuki et al. | |
| 5,990,197 A | 11/1999 | Escano et al. | |
| 6,010,771 A | 1/2000 | Isen et al. | |
| 6,093,503 A | 7/2000 | Isoyama et al. | |
| 6,099,713 A | 8/2000 | Yanada et al. | |
| 6,139,777 A | 10/2000 | Kazunori | |
| 6,147,400 A | 11/2000 | Faraci et al. | |
| 6,165,386 A | 12/2000 | Endo et al. | |
| 6,200,732 B1 | 3/2001 | Tamura et al. | |
| 6,238,847 B1* | 5/2001 | Axtell et al. | 430/322 |
| 6,248,455 B1 | 6/2001 | Adams et al. | |
| 6,297,142 B1 | 10/2001 | Mita et al. | |
| 6,306,947 B1 | 10/2001 | Morishima et al. | |
| 6,361,823 B1 | 3/2002 | Bokisa et al. | |
| 6,426,548 B1 | 7/2002 | Mita et al. | |
| 6,433,409 B2 | 8/2002 | Mita et al. | |
| 6,472,459 B2 | 10/2002 | Morales et al. | |
| 6,530,944 B2 | 3/2003 | West et al. | |
| 6,554,914 B1 | 4/2003 | Rozbicki et al. | |
| 6,583,500 B1 | 6/2003 | Abbott et al. | |
| 6,603,205 B2 | 8/2003 | Miura | |
| 6,638,847 B1 | 10/2003 | Cheung et al. | |
| 6,646,330 B2 | 11/2003 | Kubara et al. | |
| 6,651,521 B2 | 11/2003 | Carbone et al. | |
| 6,664,492 B1 | 12/2003 | Babb et al. | |
| 6,679,937 B1 | 1/2004 | Kodas et al. | |
| 6,682,584 B2 | 1/2004 | Pozarnsky et al. | |
| 6,720,499 B2 | 4/2004 | Bokisa et al. | |
| 6,773,827 B2 | 8/2004 | Higuchi | |
| 6,773,828 B1 | 8/2004 | Ooi et al. | |
| 6,774,036 B2 | 8/2004 | Goldstein | |
| 6,783,569 B2 | 8/2004 | Cheon et al. | |
| 6,828,660 B2 | 12/2004 | Abbott | |
| 6,860,981 B2 | 3/2005 | Schetty, III et al. | |
| 6,899,775 B2* | 5/2005 | Hill et al. | 156/60 |
| 6,917,098 B1 | 7/2005 | Yamunan | |
| 6,951,666 B2* | 10/2005 | Kodas et al. | 427/376.6 |
| 7,019,391 B2 | 3/2006 | Tran | |
| 7,062,848 B2 | 6/2006 | Pan et al. | |
| 7,084,067 B2 | 8/2006 | Geusic et al. | |
| 7,087,523 B2 | 8/2006 | Grigoropoulos et al. | |
| 7,153,775 B2 | 12/2006 | Geusic | |
| 7,160,629 B2 | 1/2007 | Crosby | |
| 7,179,362 B2 | 2/2007 | Dietterle et al. | |
| 7,195,702 B2 | 3/2007 | Bokisa, Sr. et al. | |
| 7,215,014 B2 | 5/2007 | Su et al. | |
| 7,252,699 B2 | 8/2007 | Perry et al. | |
| 7,262,603 B1 | 8/2007 | Benton et al. | |
| 7,294,366 B2* | 11/2007 | Renn et al. | 427/554 |
| 7,297,902 B2 | 11/2007 | Weiss | |
| 7,316,725 B2 | 1/2008 | Kodas et al. | |
| 7,351,667 B2 | 4/2008 | Hwang et al. | |
| 7,357,681 B2 | 4/2008 | Yamagami et al. | |
| 7,384,862 B2 | 6/2008 | Yamazaki et al. | |
| 7,391,116 B2 | 6/2008 | Chen et al. | |
| 7,482,540 B2 | 1/2009 | Shukushima et al. | |
| 7,507,618 B2 | 3/2009 | Dunbar | |
| 7,514,369 B2 | 4/2009 | Li et al. | |
| 7,547,479 B2 | 6/2009 | Wessling | |
| 7,776,196 B2* | 8/2010 | Fujimoto et al. | 205/92 |
| 7,786,024 B2 | 8/2010 | Stumbo et al. | |
| 7,820,097 B2* | 10/2010 | Schroder et al. | 419/45 |
| 7,867,413 B2 | 1/2011 | Lee et al. | |
| 7,879,131 B2* | 2/2011 | Yaniv et al. | 75/351 |
| 8,422,197 B2* | 4/2013 | Yaniv et al. | 361/502 |
| 8,647,979 B2* | 2/2014 | Yaniv et al. | 438/637 |
| 8,911,823 B2* | 12/2014 | Li et al. | 427/191 |
| 9,730,333 B2* | 8/2017 | Li | H05K 3/1283 |
| 9,905,339 B2* | 2/2018 | Kawato | H05K 3/1283 |
| 2002/0148386 A1 | 10/2002 | Woosman et al. | |
| 2002/0158342 A1 | 10/2002 | Tuominen et al. | |
| 2002/0185716 A1 | 12/2002 | Abys et al. | |
| 2002/0187364 A1 | 12/2002 | Heber et al. | |
| 2002/0192492 A1 | 12/2002 | Abys | |
| 2003/0025182 A1 | 2/2003 | Abys et al. | |
| 2003/0151030 A1 | 8/2003 | Gurin | |
| 2003/0168639 A1 | 9/2003 | Cheon et al. | |
| 2003/0213614 A1 | 11/2003 | Furusawa | |
| 2003/0226758 A1 | 12/2003 | Egli | |
| 2004/0026256 A1 | 2/2004 | Lindgren | |
| 2004/0026684 A1 | 2/2004 | Empedocies | |
| 2004/0079195 A1 | 4/2004 | Perry et al. | |
| 2004/0118696 A1 | 6/2004 | Zhang et al. | |
| 2004/0131934 A1 | 7/2004 | Sugnaux et al. | |
| 2004/0132299 A1 | 7/2004 | Matsuda et al. | |
| 2004/0134379 A1 | 7/2004 | Wong et al. | |
| 2004/0137710 A1* | 7/2004 | Grigoropoulos et al. | 438/622 |
| 2004/0147113 A1 | 7/2004 | Yamazaki et al. | |
| 2004/0147618 A1 | 7/2004 | Lee et al. | |
| 2004/0171211 A1 | 9/2004 | Lee et al. | |
| 2004/0175631 A1 | 9/2004 | Crocker et al. | |
| 2004/0192042 A1 | 9/2004 | Sirringhaus et al. | |
| 2004/0218136 A1 | 11/2004 | Imai et al. | |
| 2004/0232000 A1 | 11/2004 | Crosby | |
| 2004/0241532 A1 | 12/2004 | Kim | |
| 2004/0256239 A1 | 12/2004 | Whitlaw et al. | |
| 2005/0019543 A1 | 1/2005 | Lyles | |
| 2005/0026423 A1 | 2/2005 | Yamazaki | |
| 2005/0078158 A1 | 4/2005 | Magdassi et al. | |
| 2005/0097987 A1 | 5/2005 | Kodas et al. | |
| 2005/0129383 A1* | 6/2005 | Renn et al. | 385/147 |
| 2005/0145502 A1 | 7/2005 | Schetty, III et al. | |

(56) References Cited

U.S. PATENT DOCUMENTS

| | | |
|---|---|---|
| 2005/0148164 A1 | 7/2005 | Casey et al. |
| 2005/0183768 A1 | 8/2005 | Roscheisen et al. |
| 2005/0218398 A1 | 10/2005 | Tran |
| 2005/0230042 A1 | 10/2005 | Hashimoto |
| 2005/0249967 A1 | 11/2005 | Egli |
| 2005/0249968 A1 | 11/2005 | Xu et al. |
| 2005/0249969 A1 | 11/2005 | Xu et al. |
| 2005/0274480 A1 | 12/2005 | Barsoum et al. |
| 2005/0276912 A1* | 12/2005 | Yamamoto et al. .......... 427/117 |
| 2006/0001726 A1 | 1/2006 | Kodas et al. |
| 2006/0011267 A1 | 1/2006 | Kay et al. |
| 2006/0054668 A1 | 3/2006 | Severin |
| 2006/0057502 A1* | 3/2006 | Okada .................... C23C 18/14 430/313 |
| 2006/0062701 A1 | 3/2006 | Nakamura et al. |
| 2006/0068218 A1 | 3/2006 | Hooghan |
| 2006/0073680 A1 | 4/2006 | Han et al. |
| 2006/0082952 A1 | 4/2006 | Ogiwara |
| 2006/0090819 A1 | 5/2006 | Egli |
| 2006/0091121 A1 | 5/2006 | Zanolli et al. |
| 2006/0096867 A1 | 5/2006 | Bokisa et al. |
| 2006/0110424 A1 | 5/2006 | Lyles |
| 2006/0111467 A1 | 5/2006 | Reinhardt et al. |
| 2006/0116000 A1 | 6/2006 | Yamamoto |
| 2006/0141268 A1 | 6/2006 | Kalkan et al. |
| 2006/0163743 A1 | 7/2006 | Kuwabara et al. |
| 2006/0163744 A1 | 7/2006 | Vanheusden et al. |
| 2006/0183055 A1 | 8/2006 | O'Neill et al. |
| 2006/0189113 A1 | 8/2006 | Vanheusden et al. |
| 2006/0234519 A1 | 10/2006 | Pan et al. |
| 2006/0240591 A1 | 10/2006 | Grier et al. |
| 2006/0286301 A1* | 12/2006 | Murata ............... H01L 21/4867 427/372.2 |
| 2007/0007144 A1 | 1/2007 | Schetty, III |
| 2007/0019028 A1* | 1/2007 | Renn et al. ..................... 347/21 |
| 2007/0040191 A1 | 2/2007 | Bezryadin et al. |
| 2007/0051927 A1 | 3/2007 | Itoh et al. |
| 2007/0074316 A1 | 3/2007 | Alden et al. |
| 2007/0095879 A1 | 5/2007 | Holmes |
| 2007/0105395 A1 | 5/2007 | Kinzel et al. |
| 2007/0117475 A1 | 5/2007 | Tu |
| 2007/0144305 A1* | 6/2007 | Jablonski et al. ............. 75/252 |
| 2007/0145375 A1 | 6/2007 | Cho |
| 2007/0148972 A1 | 6/2007 | Hara et al. |
| 2007/0158204 A1 | 7/2007 | Taylor |
| 2007/0163643 A1 | 7/2007 | Van Duren |
| 2007/0166453 A1 | 7/2007 | Van Duren et al. |
| 2007/0175296 A1 | 8/2007 | Subramanian et al. |
| 2007/0176991 A1 | 8/2007 | Arai et al. |
| 2007/0190326 A1 | 8/2007 | Perry et al. |
| 2007/0218312 A1 | 9/2007 | Sakuyama et al. |
| 2007/0237990 A1 | 10/2007 | Kim |
| 2007/0275262 A1 | 11/2007 | Lin et al. |
| 2007/0281136 A1* | 12/2007 | Hampden-Smith et al. ................ 428/195.1 |
| 2007/0281249 A1 | 12/2007 | Tutt et al. |
| 2007/0284700 A1 | 12/2007 | Jackson et al. |
| 2007/0287022 A1 | 12/2007 | Jackson et al. |
| 2007/0287023 A1 | 12/2007 | Jackson et al. |
| 2007/0287024 A1 | 12/2007 | Jackson et al. |
| 2007/0289483 A1 | 12/2007 | Cho et al. |
| 2007/0295530 A1 | 12/2007 | Jackson et al. |
| 2008/0020208 A1 | 1/2008 | Lee et al. |
| 2008/0020304 A1 | 1/2008 | Schroder et al. |
| 2008/0075934 A1 | 3/2008 | Barlow et al. |
| 2008/0083950 A1 | 4/2008 | Pan et al. |
| 2008/0143906 A1* | 6/2008 | Allemand .............. B82Y 10/00 349/43 |
| 2008/0164557 A1 | 7/2008 | Kim et al. |
| 2008/0169122 A1 | 7/2008 | Shiraishi et al. |
| 2008/0193667 A1 | 8/2008 | Garbar et al. |
| 2008/0241391 A1 | 10/2008 | Kim et al. |
| 2008/0241414 A1 | 10/2008 | Kim et al. |
| 2008/0264205 A1* | 10/2008 | Zeng et al. ..................... 75/352 |
| 2008/0278181 A1* | 11/2008 | Zhong et al. ................ 324/693 |
| 2008/0286488 A1 | 11/2008 | Li et al. |
| 2008/0305268 A1 | 12/2008 | Norman et al. |
| 2009/0142481 A1 | 6/2009 | Chopra et al. |
| 2009/0286383 A1* | 11/2009 | Jiang et al. ................... 438/478 |
| 2010/0000762 A1* | 1/2010 | Yang et al. ................ 174/126.1 |
| 2010/0035375 A1* | 2/2010 | Grigoropoulos et al. ...... 438/99 |
| 2011/0043965 A1* | 2/2011 | Yaniv et al. ................... 361/502 |
| 2011/0300305 A1* | 12/2011 | Li et al. ......................... 427/553 |
| 2012/0049384 A1* | 3/2012 | Yaniv et al. ................... 257/774 |
| 2012/0142140 A1* | 6/2012 | Li et al. .......................... 438/98 |
| 2013/0017647 A1* | 1/2013 | Novak et al. ................... 438/98 |
| 2013/0037311 A1* | 2/2013 | Jiang et al. ................... 174/255 |
| 2013/0202901 A1* | 8/2013 | Roundhill ................. 428/473.5 |
| 2014/0057428 A1* | 2/2014 | Yaniv et al. ................... 438/610 |
| 2014/0302255 A1* | 10/2014 | Spicer et al. ................. 427/554 |
| 2014/0314966 A1* | 10/2014 | Fink et al. ..................... 427/559 |
| 2015/0201504 A1* | 7/2015 | Yaniv ..................... H05K 1/097 427/559 |

FOREIGN PATENT DOCUMENTS

| | | | | |
|---|---|---|---|---|
| CN | 101065203 | | 10/2007 | |
| CN | 101116149 | | 1/2008 | |
| EP | 1626106 A2 | | 2/2006 | |
| EP | 1626106 A3 | | 8/2006 | |
| EP | 1758166 A2 | | 2/2007 | |
| EP | 2045028 | | 4/2009 | |
| EP | 1758166 A3 | | 9/2011 | |
| JP | 11-319538 | | 11/1999 | |
| JP | 2003-292836 | | 10/2003 | |
| JP | 2004-127676 | | 4/2004 | |
| JP | 2004-143571 A | * | 5/2004 | ............ C23C 26/00 |
| JP | 2004-273592 | | 9/2004 | |
| JP | 2005-307335 | | 11/2005 | |
| JP | 2006-026602 | | 2/2006 | |
| JP | 2006-169592 | | 6/2006 | |
| JP | 2006-186330 | | 7/2006 | |
| JP | 2006-229212 | | 8/2006 | |
| JP | 2006-321948 | | 11/2006 | |
| JP | 2007-042725 | | 2/2007 | |
| JP | 2007-321215 | | 12/2007 | |
| JP | 2007-327058 | | 12/2007 | |
| JP | 2007-332347 | | 12/2007 | |
| JP | 2009-097082 | | 5/2009 | |
| WO | 97/08924 | | 3/1997 | |
| WO | 2006/076603 | | 7/2006 | |
| WO | 2006072959 | | 7/2006 | |
| WO | 2007/004033 | | 1/2007 | |
| WO | 2007/013393 | | 2/2007 | |
| WO | 2008/144504 | | 11/2008 | |
| WO | 2009/111393 | | 9/2009 | |

OTHER PUBLICATIONS

S. Peter Pappas, editor; UV Curing: Science and Technology; technology marketing Corporation, Stamford Connecticut, USA; 1976 (no month), excerpt pp. 96-129.*
Richard J Lewis, Sr., editor; Hawley's Condensed Dictionary, 12th edition; Van Nostrand Reinhold Company, New York; 1993 (no month); excerpt p. 313.*
R.J. Lewis, Sr., editor; Hawley's Condensed Chemical Dictionary, 12th edition; Van Nostrand Reinhold company, New York; 1993 (no month), excerpts pp. 911-912 & 996.*
Chan et al., "Plasmon it Properties of Copper Nanoparticles Fabricated by Nanosphere Lithography"; Nano Letter, vol. 7, No. 7; pp. 1947-1952; Jun. 13, 2007.*
Webster's Ninth New Collegiate Dictionary; Merriam-Webster Inc.; Springfield Massachusetts USA; 1990 (no month) excerpt pp. 885-886, 1220.*
International Search Report and Written Opinion, PCT/US09/49510, dated Oct. 19, 2009.
International Preliminary Report on Patentability, International Application No. PCT/US2009/044196, dated Nov. 25, 2010, 6 pages.
International Preliminary Report on Patentability, International Application No. PCT/US2009/044195, dated Nov. 25, 2010, 5 pages.

(56) References Cited

OTHER PUBLICATIONS

International Preliminary Report on Patentability, PCT/US2008/063890, dated Dec. 3, 2009.
International Search Report and Written Opinion of the International Searching Authority, or the Declaration for PCT/US10/28799, dated May 19, 2010.
International Search Report and the Written Opinion on the International Searching Authority for PCT/US10/28811, dated May 18, 2010.
International Search Report and Written Opinion for Application No. PCT/US/09/35717, dated May 5, 2009, 7 pages.
Niizeki et al. "Laser Sintering of Ag Nanopaste Film and Its Application to Bond-Pad Formation," 2008 Electronic Components and Technology Conference, IEEE, pp. 1745-1750.
Lee et al. "Spontaneous Growth Mechanism of Tin Whiskers," Acta mater. vol. 46, No. 10, pp. 3701-3714, 1998.
Gaylon, "Annotated Tin Whisker Bibliography and Anthology," IEEE Transactions on Electronics Packaging Manufacturing, vol. 28, No. 1, Jan. 2005, pp. 94-122.
Lal et al., "Role of Intrinsic Stresses in the Phenomena of Tin Whiskers in Electrical Connectors," IEEE Transactions on Electronics Packing Manufacturing, vol. 28, No. 1, Jan. 2005, pp. 63-74.
Boettinger et al., "Whisker and Hillock Formation on Sn, Sn—Cu and Sn—Pb Electrodeposits," Acta Materialia, 53, Sep. 8, 2005, pp. 5033-5050.
Mitooka et al., "Effect of Laser Irradiation on Generation and Growth of Whiskers in Tin-Electroplated Film," J. Japan Inst. Metals, vol. 73, No. 3, (2009), pp. 226-233.
Osenbach et al., "Sn Corrosion and Its Influence on Whisker Growth," IEEE Transactions on Electronic Packaging Manufacturing, vol. 30, No. 1, Jan. 2007, pp. 23-35.
Osenbach et al., "Sn Whiskers: Material, Design, Processing, and Post-Plate Reflow Effects and Development of an Overall Phenomenological Theory," IEEE Transactions on electronics Packaging Manufacturing, vol. 28, No. 1, Jan. 2005, pp. 36-62.
Osterman, "Mitigation Strategies for Tin Whiskers," Release 1.0, Aug. 28, 2002, 11 pages, CALCE EPSC.
Lu et al. "Ultrahigh Strength and High Electrical Conductivity in Copper" Science Magazine, Apr. 2004, vol. 304, 6 pages.
Volkman et al. "Ink-jetted Silver/Copper Conductors for Printed RFID Applications" Materials Research Society magazine, 2004, vol. 814, 6 pages.
Wu et al. "One-Step Green Route to Narrowly Dispersed Copper Nanocrystals" Journal of Nanoparticle Research, 2006, pp. 965-969, 5 pages.
Curtis et al. "Spray and Inkjet Printing of Hybrid Nanoparticle-Metal-Organic Inks for Ag and Cu Metallizations" Materials Research Society magazine, 2001, vol. 676, 6 pages.
Shacham-Diamand "Electroless Copper Deposition Using Glyoxylic Acid as Reducing Agent for Ultralarge Scale Integration Metallization" manuscript published by, Electrochemical and Solid-State Letters, Apr. 2000, pp. 279-282, 4 pages.
Yeshchenko et al. "Size-Dependent Melting of Spherical Copper Nanoparticles" article published by National Taras Shevchenko Kyiv University, Jan. 2007, 16 pages.
62124084, Jun. 5, 1987, Japan, English abstracts only, No JP patent documents.
2008006513, Jan. 17, 2008, Japan, English abstracts only, No JP patent documents.
International Search Report and Written Opinion for International Application No. PCT/US09/44196 dated Jun. 30, 2009, 13 pages.
International Search Report and Written Opinion for International Application No. PCT/US09/44195 dated Jun. 25, 2009, 7 pages.
Virang G. Shah, "Trimming and Printing of Embedded Resistors Using Demand-Mode Ink-Jet Technology and Conductive Polymer," IPC Printed Circuit Expo (2002) pp. 1-5.
International Search Report for PCT/US08/63890 dated Aug. 6, 2008, 9 pgs.
Kogelschatz, "Excimer Lamps: History, Discharge Physics, and Industrial Applications", Proc. SPIE, vol. 5483, 2004, pp. 272-286.
Kim et al., "Cyclic Properties of Si—Cu/Carbon Nanocomposite Anodes for Li-Ion Secondary Batteries", Journal of the Electrochemical Society, vol. 152. No. 3, pp. A-523-A-526, Jan. 24, 2005, retrieved from internet Aug. 26, 2010.
International Search Report and the Written Opinion of the International Searching Authority for PCT/US10/042169, dated Sep. 7, 2010, 4 pages.
Yaniv, "Novel Inkettable Copper Ink Utilizing Processing Temperatures Under 100 Degrees C Without the Need of Inert Atmosphere", Presentation at Printed Electronics Europe Conference, pp. 1-25, Apr. 7-8, 2009, retrieved from internet Aug. 26, 2010.
International Preliminary Report on Patentability, PCT/US2010/042169, dated Jan. 17, 2012.
Notice on the First Office Action: Patent Application No. 200980108344.1, dated Jan. 21, 2012.
MSDS: Fluorad by 3M, Fluorosurfactant FC-4430, Mar. 2, 2002; 4 pages; www.3m.com/paintsandcoatings.
Supplemental European Search Report; Application No. EP 09774505 dated Jun. 29, 2011.
Notice of the First Office Action, Application No. 200880021733.6 dated Jun. 22, 2011.
Supplementary European Search Report, Application No. EP08755692, dated Aug. 6, 2010.
European Patent Office, Examination Report. Application No. 08 755 692.4. Apr. 13, 2012.
Champion et al., "Sintering of copper nanopowders under hydrogen: an in situ X-ray diffraction analysis", Materials Science and Engineering A, vol. 360. No. 1-2, Nov. 1, 2003, pp. 258-263.
10-308119, Nov. 17, 1998, Japan, no Japanese patent documents supplied; only Espacenet English abstracts.
2001-325831, Nov. 22, 2001, Japan, no Japanese patent documents supplied; only Espacenet English abstracts.
Korean Intellectual Property Office, Chemistry & Biotechnology Examination Bureau, Notice to File a Response, Patent Application No. 10-2010-7022240, dated May 8, 2012.
TEGO 425 Datasheet; http://evonik.tego.de/pdf/daten/amer/Flow_425.pdf.
United States Patent & Trademark Office, Final Office Action Summary, U.S. Appl. No. 12/391,817, dated Aug. 27, 2012.
United States Patent & Trademark Office, Non-Final Office Action Summary, U.S. Appl. No. 12/496,453, dated Jun. 13, 2012.
European Patent Office, Examination Report, Application No. 09774505.3, dated. Sep. 20, 2012.
United States Patent & Trademark Office, Non-Final Office Action, U.S. Appl. No. 12/466,306, dated Nov. 7, 2012.
Japanese Patent Office, Non-Final Office Action, Japanese Patent Application No. 2011-509765, dated Jul. 23, 2013.
The State Intellectual Property Office of the People's Republic of China, Application No. 200980118341.6, Notice on the First Office Action, Feb. 17, 2013.
United States Patent & Trademark Office, Non-Final Office Action, U.S. Appl. No. 13/260,893, dated Mar. 11, 2013.
Translation of Office Action and Taiwan IPO Search Report, Taiwan Invention Patent Application No. 0977118130, dated May 31, 2013.
The State Intellectual Property Office of the People's Republic of China, Notice on the Second Office Action and Search Report, Patent Application No. 200980108344.1, dated Dec. 5, 2012.
Korean Intellectual Property Office, Notice of Reasons for Rejection, Application No. 2010-549783, dated Dec. 18, 2012.
The State Intellectual Property Office of the People's Republic of China, Notice on the Second Office Action, Application No. 200980125925.6, dated Feb. 25, 2013, 11 pages, CN.
Translated Text of the First Office Action for Application No. 201080015842.4, dated May 6, 2013, 6 pages, CN.
Non-Final Office Action, Notice of Reasons for Rejection, Japanese Patent Application No. 2012-502281, dated Jul. 16, 2013.
The State Intellectul Property Office of the People's Republic of China, Notice on the First Office Action, Application No. 201080023851.8, dated Jul. 15, 2013, 8 pages, CN.
The State Intellectual Property Office of the People's Republic of China, Notice on the First Office Action, Application No. 201080032626.0, dated Jun. 28, 2013, 7 pages, CN.

(56) References Cited

OTHER PUBLICATIONS

The State Intellectual Property Office of the People's Republic of China, Notice on the Third Office Action, Application No. 200980125925.6, dated Nov. 5, 2013, 1 page, CN.
Japanese Patent Office, Non-Final Office Action, Notice of Reasons for Rejection, Japanese Patent Application No. 2011-516873, dated Oct. 22, 2013, English Translation.
Japanese Patent Office, Final Office Action, Notice of Reasons for Rejection, Japanese Patent Application No. 2010-549783, dated Oct. 15, 2013.
Japanese Patent Office, Non-Final Office Action, Notice of Reasons for Rejection, Japanese Patent Application No. 2012-503530, dated Jan. 21, 2014.
The State Intellectual Property Office of the People's Republic of China, Notice on the Third Office Action; Patent Application No. 200980108344.1, dated Feb. 27, 2014, English Translation.
The State Intellectual Property Office of the People's Republic of China, Translated text of Notice on the Second Office Action; Patent Application No. 201080015842.4, dated Mar. 10, 2014.
Japanese Patent Office, Non-Final Office Action, Notice of Reasons for Rejection, Japanese Patent Application No. 2011-516873 dated Mar. 24, 2014.
The State Intellectual Property Office of the People's Republic of China, Notice on the Second Office Action; Patent Application No. 201080023851.8, dated Apr. 8, 2014, CN.
European Patent Office, European Search Report, Application No. 09747709.5, dated Mar. 12, 2014.
The State Intellectual Property Office of the People's Republic of China, Notice on Grant of Patent Right for Invention, Application No. 200880021733.6, dated Apr. 20, 2012.
The State Intellectual Property Office of the People's Republic of China, Notice on the First Office Action, Application No. 200980125925.6, dated Mar. 31, 2012, 8 pages, CN.
The State Intellectual Property Office of the People's Republic of China, Notice on the Second Office Action; Patent Application No. 201080032626.0, dated Apr. 16, 2014.
European Patent Office, European Search Report for International Application No. 10756901.4, dated Oct. 10, 2014.
Japanese Patent Office, Decision on Rejection, Japanese Patent Application No. 2011-509765, dated Sep. 29, 2014.
European Patent Office, European Search Report, Application No. 10759242.0, dated Sep. 3, 2014.
Japanese Patent Office, Final Office Action, Notice of Reasons for Rejection, Japanese Patent Application No. 2010-549783, dated Oct. 14, 2014.
European Patent Office, Examination Report, Application No. 09774505.3, dated Oct. 22, 2014.
Taiwan International Patent & Law Office, Translation of Notice of Office Action and Search Report, Taiwan Invention Patent Application No. 099109236, dated Oct. 23, 2014.
The State Intellectual Property Office of the People's Republic of China, Text of the Third Office Action; Patent Application No. 201080015842.4, dated Sep. 5, 2014.
Taiwan International Patent & Law Office, Translation of Notice of Office Action and Search Report, Taiwan Invention Patent Application No. 098116219, dated Oct. 15, 2014.
United States Patent & Trademark Office, Non-Final Office Action Summary, U.S. Appl. No. 14/073,986, dated Dec. 1, 2014.
Japanese Patent Office, Final Office Action, Notice of Reasons for Rejection, Japanese Patent Application No. 2012-502281, dated Aug. 11, 2014.

\* cited by examiner

PROPANE                    HEXANE

DECANE

METALLIC INK

CROSS-REFERENCE TO RELATED APPLICATIONS

This application claims the benefit under 35 U.S.C. § 119(e) of U.S. provisional application 60/938,975, filed on May 18, 2007, which is incorporated by reference herein in its entirety.

BACKGROUND

The present disclosure is directed towards metallic ink such as copper. Metal conductors on printed circuit boards (PCB) and flex tape connectors are generally copper (Cu) lines that are either laminated onto the PCBs or are deposited by electroplating techniques. Patterning the copper material to form conducting lines, wire and connecting leads between components requires photolithography and acid etching of blanket copper films. Alternatively, such methods can be used to define copper line patterns during the plating process. In either case, the chemicals used to etch the copper and the resultant chemical waste generated from the processes add significant cost to the products that are made. The cost is further increased due to the time and labor necessary for the etching and photopatterning process steps.

An alternative technique to lamination and electroplating for forming metal conductors on PCB includes printing the metal lines. Silver metal based inks and pastes exist for inkjet printing, screen printing and other printing techniques. Although silver is highly conductive and can be processed at low temperatures, it is an expensive metal, making it cost prohibitive for many applications.

SUMMARY

In contrast to silver, copper metal is a standard in the electronics industry and is about one tenth the cost. Accordingly, copper is a suitable alternative to silver for use in applications such as electronic interconnects, radio-frequency ID tags and display manufacturing process, among others.

The details of one or more embodiments of the invention are set forth in the description below and the accompanying drawings. Other features will be apparent from the description, the drawings and the claims.

BRIEF DESCRIPTION OF DRAWINGS

FIG. 9A illustrates an example of printing and photosintering a nanoparticle film;

DETAILED DESCRIPTION

Figure 1:
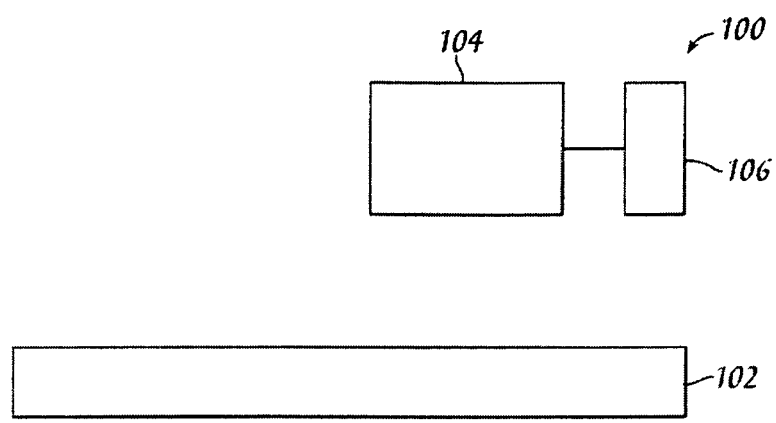
FIG. 1 illustrates a system for fabricating conductors on a surface of a substrate.

Referring to FIG. 1, a system 100 is shown for fabricating conductors on the surface of a substrate 102. The system 100 includes a printer device 104, such as an inkjet printer, capable of printing metal inks onto the substrate surface. However, any printing device capable of printing inks may be used such as aerosol jet. Other deposition devices can be used as well. For example, metal inks can be deposited using sprays, draw-down techniques, and spin-casting, among others. The inks may be printed in particular patterns or cover the entire substrate surface. The printer device 104 includes a storage compartment 106 for storing the ink solution to be printed. Alternatively, the ink solution may be provided externally from an ink source to the printer device 104.

To make copper-based conductors from metal inks suitable for inkjet printing, ink solutions may be made of copper particles that are small enough to be processed by inkjet heads. In general, this includes copper particles that have a diameter of 1 micron or less and, in some cases, 0.1 micron (100 nanometers) or less in diameter. The copper particles are kept in a solvent and/or suspension during storage and printing. The inkjet solutions may be printed on multiple substrates including inflexible inorganic substrates such as glass or flexible organic substrates such as polyimide or polyethylene. In some implementations, paper substrates can be used. Other substrates may be used as well.

After printing a copper-based ink solution on a substrate surface, the ink is pre-cured or dried. If the ink solution is printed on a polymer substrate, the pre-curing is performed at temperatures generally less than 200° C. and preferably less than 100° C. to prevent variations in the substrate, such as changes in elasticity/plasticity, shrinkage, warping, and/or damage to the substrate. The ink solution may be cured in air or other gas environments such as nitrogen and argon. Pre-curing in inert environments may increase the cost and complexity of the inkjet printing system. Typically, the copper particles are dark or black and absorb light such that the pre-cured also exhibits a dark or black light absorbing color. In addition, the pre-cured ink has high resistivity. The resistivity of the pre-cured ink may be reduced by fusing the copper particles together through melting.

Before the printed metal nanoparticles can be sintered by the light flash, the printed images should be dry and free from liquid components to prevent the rapid evaporation of these liquids, which may result in the formation of holes in the printed metal nanoparticles. This pre-sintering drying step may be carried out by heating the printed material at temperatures up to 140° C. in air for time periods of up to 1 hour. The temperature and time should be kept as low and short as possible to prevent oxidation of the metal nanoparticles. Use of these pre-sintering conditions requires that the components of the metal nanoparticle inks are volatile under these experimental conditions. For printed materials that undergo rapid oxidation under these conditions, or that retain their components, other conditions may be used to remove them. These include heating to higher temperatures under a nitrogen, hydrogen, or gas forming atmosphere, or heating under high vacuum conditions. Inclusion of non-volatile components in the metal ink formulations should be avoided because their occlusion within the final metal film will cause it to have a higher resistivity that that of bulk metal. In order to facilitate this drying step, liquids that have low boiling points and low heats of vaporization are favored, and solids should be used that will completely sublime under these conditions. If such components are not viable, an alternate strategy may be used where the compounds decompose to volatile products under these thermal conditions.

However, bulk copper does not melt until above approximately 1000° C. Although the melting temperature may be lower for copper particles having diameters of 60 nm or less, it is still well above the process temperatures suitable for polymer substrates. Furthermore, copper readily oxidizes in air and at elevated temperatures, which may lead to an increase in resistivity, not a decrease.

To fuse the copper particles without overheating the substrate or and little or no oxidation, the pre-cured film may be photosintered by exposing it to an intense but brief pulse of light from a light source such as a xenon lamp. The light from the light source is absorbed by the film because of its dark or black color. Thus, it is the film and not the substrate that is directly heated. If the light intensity is high enough (on the order of a few Joules per square centimeter) and the pulse length is short enough (on the order of 300 microseconds or less), then the energy transferred to the pre-cured film is enough to allow the copper particles to fuse together without transferring substantial energy to the substrate.

Photosintering may be applied to films that include silver and/or copper particles. The photosintering process will also work with other metal particle films. The resistivity of photosintered silver films is approximately four times the resistivity of bulk silver. For copper photosintered films, the resistivity is on the order of 10 to 40 times higher than bulk copper. For example, the resistivity of photosintered copper nanoparticle films is in the range of $10^{-5}$ to $10^{-7}$ ohm-cm can be achieved. Such resistivity values are sufficient for use in applications such as electronic interconnects, antennas in RFID tags and for display manufacturing processes on glass and flexible substrates. Additionally, photosintering does not require precise optics for alignment and may be scaled up for manufacturing over large areas of material.

Formulation of metal nanoparticles into inks may require the addition of a dispersant. These dispersants have head groups that can associate with the metal nanoparticle, and a tail group that is compatible with the vehicle (solvent) used in the liquid phase component mixture of the ink. Such dispersants commonly have a hydrophobic and a hydrophilic end, and the tail group should preferentially have a long chain alkyl or alkoxy group functionality. The design of the head group can be made on the basis of the "hard and soft acid and base principle," and the use of excluded volume calculations.

The differential complexation behavior of metals and ligands (dispersants) has been explained in terms of electron-pair donating Lewis bases and electron-pair accepting Lewis acids. Association between them is shown in the following equation:

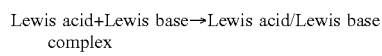

Lewis acids and Lewis bases have been classified as being hard, borderline, or soft. According to the hard soft acid base (HSAB) principle: "Hard acids prefer to bind to hard bases" and "Soft acids prefer to bind to soft bases."

A wide range of atoms, ions, molecules and molecular ions have been classified as being hard, borderline or soft Lewis acids or Lewis bases, moving the analysis from traditional metal/ligand inorganic chemistry into the realm of organic chemistry. Tables A and B provide short lists classifying Lewis acids and bases into these three categories.

TABLE A

| Classification of Lewis Acids | | |
| --- | --- | --- |
| Hard | Soft | Borderline |
| $H^+$, $Li^+$, $Na^+$ | Cu, $Cu^+$, Ni, Ag | $Cu^{2+}$, $Ni^{2+}$ |

Important observations come from Table A. The first is that elemental copper is soft, and although copper nanoparticles behave like $Cu^{2+}$, which is classified as borderline, the larger copper nanoparticles may show a soft Lewis acid behavior. Similarly, any $Cu^+$ formed from $Cu_2O$, is also classified as soft.

TABLE B

| Classification of Lewis Bases | | |
| --- | --- | --- |
| Hard | Soft | Borderline |
| $H_2O$, $OH^-$, $Cl^-$, $RCO_2H$ (acids) ROH (alcohols), $R_2O$ (ethers), $RNH_2$ (amines) | $R_2S$ (sulfides), $RCH=CH_2$ (alkenes), $C_6H_6$ (benzene), CO | $C_6H_5NH_2$ (aniline) $C_5H_5N$ (pyridine) |

If one continues with the premise that copper nanoparticles may be classified as either borderline or soft, it may be advantageous to target some dispersants that fall in the borderline or soft Lewis base classification.

Hard [Lewis] acids bind to hard [Lewis] bases to give charge-controlled (ionic) complexes. Such interactions are dominated by the +/−charges on the Lewis acid and Lewis base species. Soft [Lewis] acids bind to soft [Lewis] bases to give FMO-controlled (covalent) complexes. These interactions are dominated by the energies of the participating frontier molecular orbitals (FMO), the highest occupied molecular orbital (HOMO) and the lowest unoccupied molecular orbital (LUMO). Using this analysis, the contributing aspects of charge-controlled and FMO-controlled Lewis acid/base complexation are separated and quantified. Hard Lewis acids have or are:
Atomic centers of small ionic radius
High positive charge
Species do not contain electron pairs in their valence shells
Low electron affinity
Likely to be strongly solvated
High energy LUMO's
Soft Lewis acids have or are:
Large radius
Low or partial positive charge
Electron pairs in their valence shells
Easy to polarize and oxidize
Low energy LUMO's, but large magnitude LUMO coefficients
Hard Lewis bases have or are:
Small, highly solvated, electronegative atomic centers: 3.0-4.0
Species that are weakly polarisable
Difficult to oxidize
High energy HOMO's
Soft Lewis bases have or are:
Large atoms of intermediate electronegativity in the range of 2.5-3.0.
Easy to polarize and oxidize
Low energy HOMO's but large magnitude HOMO coefficients.

Borderline species have intermediate properties. There is a qualifier saying that it is not necessary for species to possess all properties. HSAB is not a theory, since it does not explain variations in the strength of chemical bonds. The word 'prefer' in the HSAB Principle implies a rather modest effect, and HSAB should be used as a guide to choosing Lewis acid-Lewis base pairs and not as a rigid rule.

The qualitative HSAB theory has been expanded with a quantitative definition of chemical hardness. When the electronegativity, as defined in the Mullikan scale, is the first derivative in a plot of energy versus the amount of electrons with fixed nuclear charge in an atom or molecule, then the chemical hardness is the second derivative. Hardness and electronegativity are therefore related, and in this sense hardness is a measure of resistance to deformation or change. A value of zero denotes maximum softness (Table C).

TABLE C

| Chemical Hardness | | | |
|---|---|---|---|
| $Na^+$ | 21.1 | $H_2O$ | 7.0 |
| $Ni^{2+}$ | 8.5 | $F^-$ | 7.0 |
| $Cu^{2+}$ | 8.3 | $NH_3$ | 6.9 |
| Cu | 3.25 | $OH^-$ | 5.6 |
| Ni | 3.24 | $Cl^-$ | 4.7 |

Figure 18:
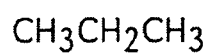
FIG. 18 illustrates linear structures of propane, hexane and decane.
Figure 18:
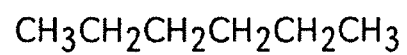
Figure 18:
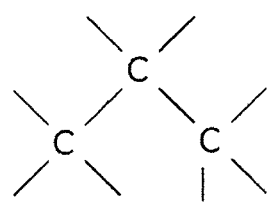
Figure 18:
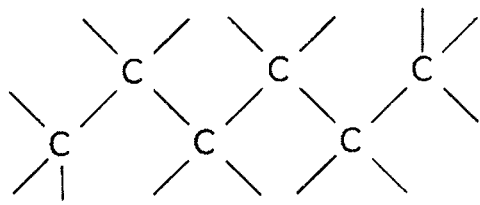
Figure 18:
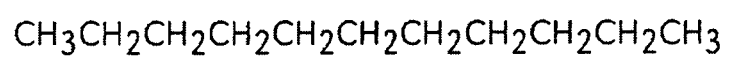
Figure 18:
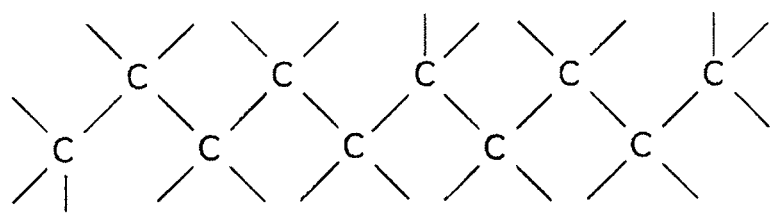

The compounds used as dispersants have long-chain alkyl $(CH_2)_n$ or ethoxy $(CH_2CH_2O)_n$ groups. These groups are linked together by either carbon-carbon or carbon-oxygen single bonds. These single bonds allow for 3-dimensional vibrations and rotations, which gives them a high degree of flexibility. An explanation for the need to use dispersants that have flexible long-chain tail groups is that through combinations of vibrations and rotations these groups occupy more space than do short-chain tail groups, and that this space is not accessible for a second copper nanoparticle to approach. In order to quantify this excluded volume effect, calculations were carried out on propane ($C_3H_8$), hexane ($C_6H_{14}$) and decane ($C_{12}H_{26}$). These three alkyl chain compounds are shown structurally in FIG. 18. In each case the linear structure is shown, and in each case the C—C—C angle will be close to 109° 28', the tetrahedral angle.

The computational results are collected in Table D.

TABLE D

| | | | | | |
|---|---|---|---|---|---|
| Computational data on alkanes | | | | | |
| Alkane | Length (Å) | "Excluded" Volume (Å) | Van der Waals Volume (Å) | Molecular Volume (Å) | Molecular Surface (Å) |
| Propane | 4.1 | 36.1 | 56.2 | 77.4 | 103.5 |
| Hexane | 6.7 | 157.5 | 81.9 | 106.3 | 146.0 |
| Decane | 12.0 | 904.8 | 132.4 | 176.0 | 231.7 |

Length (Angstroms Å) - end to end (heavy atoms) distance in extended conformation. For propane this is the $C_1$ to $C_3$ distance; for hexane this is the $C_1$ to $C_6$ distance; and for decane this is the $C_1$ to $C_{12}$ distance.
"Excluded" Volume (Å) - volume based on length (d) as (⅙)πd³. The excluded volume for a given object is defined as that volume surrounding and including a given object, which is excluded to another object The excluded volume is always defined for a pair of objects.
Van der Waals Volume (Å) - volume based on van der Waals radii. Two atoms that are not covalently bound cannot approach each other closer than a certain minimal distance. The closest proximity depends upon the type of atoms involved. This phenomenon can be described by assigning a value called a van der Waals radius to each atom type in such a way that the sum of these quantities for a given atom pair is equal to their closest possible distance. The van der Waals radii here are the "touching points" of the hydrogen atoms in the alkyl or ethoxy chains. The van der Waals volume is the volume of a molecule in which every heavy atom is represented by its van der Waals radii molecular surface, which is the surface formed by a sphere (typically 1.4 Å radii) rolled over the molecule in van der Waals representation.
Molecular Volume (Å) - volume occluded by rolling a spherical probe of 1.4 Å. This is the volume occupied by one mole of the compound, which is numerically equal to the molecular weight divided by the density. The molecular volume is the volume of the above excluded volume, or the volume that cannot be occupied due to the non-zero size of a molecule
Molecular Surface (Å) - area occluded by rolling a spherical probe of 1.4 Å. This is the equivalent of obtaining the surface area.

These data show that because of the distance cubed dependence on the distance, there is a large increase in the "excluded" volume as the length of the chain increases. This "excluded" volume represents the space "occupied" by the flexible alkyl (or ethoxy) chain, and it is space that cannot be occupied by a second copper nanoparticle. The larger this "excluded" volume the more effective is the dispersant at keeping the copper nanoparticles separated. A second aspect of this "excluded" volume is that large values allow for low concentrations of the compound to be effective in providing a high level of coverage of the nanoparticle, and therefore a high degree of effectiveness as a dispersant.

Polymers that have been successfully used in the formulation of inks that have been subsequently cured by photonic cured to give good conductors are Triton X-100, Triton X-15, Triton X-45, Triton QS-15, BYK111, MA, SMA, PT, HCS-P, HCS-N, PVP, polyvinyl alcohol, polyethylene glycol, polysiloxanes.

The rationale behind the use of polymers as dispersants is that they often have higher viscosities than do the typical liquids used as vehicles in conductive inks, and that because of their multiple binding sites to metal nanoparticles, they can be used in lower concentrations than momomeric dispersants, and still confer monolayer coverage of the metal nanoparticle. Higher viscosities are important because they facilitate the creation of good dispersions and inks that can be printed using inkjet methods. Lower concentrations of the dispersant are favorable because there is less organic material to be removed during the curing (sintering) process.

Three actions are required when converting a powder into a stable dispersion. These are wetting the surface, breaking up agglomerates, and stabilizing the dispersed particles against flocculation. Dispersants and surfactants often play an important role at each stage, but the dispersant that provides the best performance in one stage may not be the best one for the subsequent stages. As a result multiple detergents and surfactants may be required.

Wetting a powder does not always lead to a good dispersion since it may just be the agglomerates that are wetted in the process. In some cases the nanoparticles may be agglomerated through a salt bridge comprising a soluble salt that had been precipitated along with them. These salt bridges may be dissolved by the dispersant to break up the agglomerates. Dispersants that absorb into crevices can also reduce the energy required to propagate cracks through the solid, and can thereby function as grinding aids.

Once deagglomeration has occurred, it is necessary to maintain the dispersion stability. The balance between the forces of attraction and repulsion will determine whether the particles move to cluster back into agglomerates, or whether they remain dispersed. The maintenance of a dispersion can be assisted by mechanically breaking up the agglomerates with a ball mill or a similar device. Such a mechanical process is carried out in the presence of a dispersant in order to avoid re-agglomeration once the process is ceased.

Two strategies can be used in choosing dispersants, these are steric stabilization and electrostatic stabilization. Steric stabilization is usually achieved with a nonionic dispersant or polymer, and electrostatic stabilization with an ionic dispersant or polymer. A dispersant with a high hydrophile-lipophile balance (HLB) is used for aqueous dispersions, and one with a low HLB for dispersions in non-polar organic liquids. Metal nanoparticles can be charged, and this property can allow for electrostatic stabilization to be used to disperse them. The amount of dispersant used should be adequate to give monolayer coverage.

The function of a dispersant is to prevent nanoparticles from aggregating and agglomerating together. Small metal nanoparticles are reactive, and if not dispersed they will attach to each other to form agglomerates. These larger agglomerates are unsuitable for manufacturing conductive inks. A dispersant has a head group that associates with the metal nanoparticle and a tail group that excludes other metal nanoparticles from approaching closely to it. Steric dispersants have a long chain tail group that by bending and rotating sweeps out a large "excluded volume" that cannot be occupied by other metal nanoparticles. A high excluded volume is desirable.

The concentration of the dispersant is chosen to achieve monolayer coverage of the nanoparticle by the head groups of the dispersant. This situation ensures that no sites remain on the nanoparticle that is accessible to other nanoparticles for aggregation or agglomeration. Monolayer coverage is also utilized for preparing the best dispersions and inks. A dispersant is designed to have a head group that is chemically compatible with the nanoparticle, and a tail group that is chemically compatible with the vehicle (solvent). In a dispersion the dispersant acts as a molecular bridge between the nanoparticle and the vehicle, thereby keeping the nanoparticles widely separated by several molecular layers.

Metal nanoparticles have charged surfaces. This charging can occur in metal nanoparticles prepared by either a dry or a wet process. This charge can be either positive or negative. Metal inks have been prepared using anionic components such as halide or carboxylate ions, or with cationic components such as hydrogen ions or group I cations.

In selecting a dispersant, the choice of functionality to act as an anchoring head group is important. The absorption of the anchor to the nanoparticle must be stronger than the absorption of the vehicle in the system. The absorption may arise from charge attraction, specific donor-acceptor bands between unshared electron pairs and empty molecular orbital, hydrogen bonding, or electrostatic field trapping of polarizable molecules. The use of polymers having multiple absorption anchors needs to be also considered because this allows for additivity of anchoring sites to be achieved, and for multiple site coverage of the copper nanoparticle to be accomplished.

Figure 20:
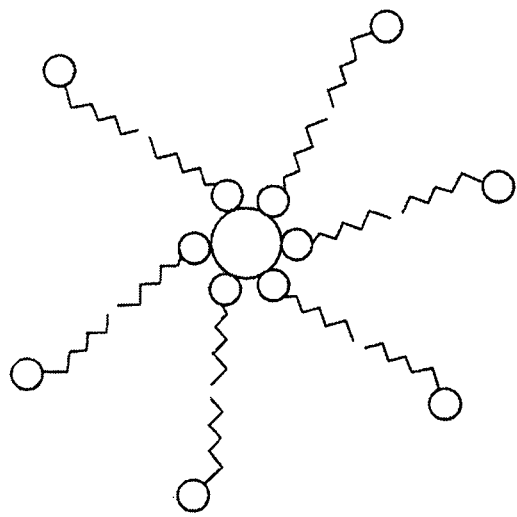
FIG. 20 is a representation of a double layer of dispersant onto a copper nanoparticles.

The solubility of the tail of the dispersant in the vehicle must also be considered because the dispersant acts as a boundary between the copper nanoparticles and the vehicle. A dispersant is most effective if the anchoring head group preferentially associates with the copper, and the tail group with the vehicle. When the dispersant (surfactant) stabilizes the dispersion, a monolayer on the solid usually achieves the maximum dispersion stability that can be attained for that system. The use of less than a monolayer leaves open sites on the copper that can agglomerate, and if more than a monolayer is absorbed, then the second molecular layer will likely be orientated in the opposite direction from the first layer, thereby reducing the compatibility of the copper nanoparticle with the vehicle (FIG. 20).

The quantity of dispersant $m_d$ required disperse a given mass of copper $m_c$ in a given volume of liquid V can be calculated from the surface area of the copper ($A_c$), the molar mass of the surfactant $M_d$, and the molar area coverage of the dispersant $A_d$ by the equation:

$$M_d = \frac{M_d m_c A_c}{A_d}$$

Figure 21:
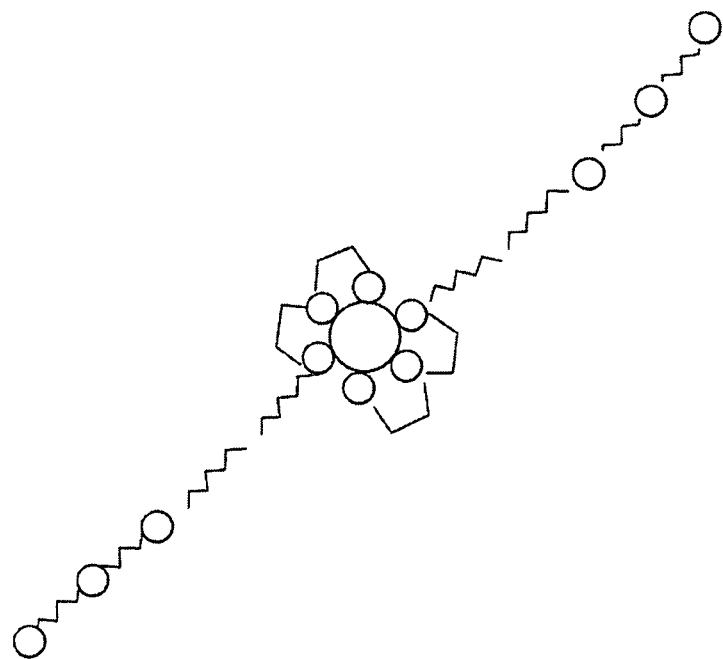
FIG. 21 is a representation of a double layer of a polymeric dispersant onto a copper nanoparticle.

As shown in FIG. 21, multiple head groups in polymeric dispersants can be advantageous because they can have multiple anchoring sites on the copper nanoparticles. This can lead to increased attraction between the nanoparticle and the dispersant, and since the dispersant occupies multiple sites on the copper nanoparticle, lower concentrations can be used.

Gravity, buoyancy, and drag act on nanoparticles when they are settling in a liquid. Gravity and buoyancy are given by:

Gravity: $F_G = \rho_s V g$;
Buoyancy: $F_b = \rho V g$;
where, $\rho_s$ and $\rho$ are the sediment and fluid densities, V is the volume of the sediment particle, and g is the acceleration of gravity.

Drag: The drag force depends on the shape, size, and relative velocity of the nanoparticle, and on the density and viscosity of the fluid. It is given by:

$$F_D = \frac{1}{2} C_D u^2 A$$

where u is the velocity of the nanoparticles and A is the cross-sectional area of particles perpendicular to its trajectory. $C_D$ is the drag efficient, a non-dimensional number that depends on the shape of the particle, the fluid's viscosity, and particle size.

The settling velocity is given by equation 1:

$$V = \frac{1}{18\eta}(\rho_s - \rho)gD^2$$

where η is the dynamic viscosity of fluid, $\rho_s$ and $\rho$ are the sediment and fluid densities, D is the diameter of the nanoparticles, and g is gravity.

If the volume concentration (Cs) of the nanoparticles is considered, the settling velocity can be described as:

$$V = \frac{1}{18\eta}(\rho_s - \rho)gD^2(1-Cs)^n$$

Where n varies from 2.3 to 4.6, depending on the Reynolds number of the nanoparticle.

From this equation:
1) A high loading concentration of nanoparticles will improve the dispersion;
2) Increasing the viscosity of vehicle will improve the dispersion;
3) The smaller particle size nanoparticles will suspend for a longer time.

What is the critical nanoparticle size that allows nanoparticles to suspend for 3 months, or even 6 months, in a vehicle? An estimation of this size using equation 1 is given in Table E.

TABLE E

| Size nm | Density of particle (g/cubic cm) | Density of vehicle (g/cubic cm) | Viscosity (CPs) | Diameter nm | Velocity cm/s | Travel in 1 month cm |
|---|---|---|---|---|---|---|
| 100 | 8.9 | 1 | 2 | 100 | 2.15056E−06 | 5.5742 |
| 50 | 8.9 | 1 | 2 | 50 | 5.37639E−07 | 1.3936 |
| 20 | 8.9 | 1 | 2 | 20 | 8.60222E−08 | 0.2230 |
| 10 | 8.9 | 1 | 2 | 10 | 2.15056E−08 | 0.0557 |
| 5 | 8.9 | 1 | 2 | 5 | 5.37639E−09 | 0.0139 |
| 1 | 8.9 | 1 | 2 | 1 | 2.15056E−10 | 0.0006 |

Brownian motion is not considered in this calculation.

If increasing the nanoparticle loading concentration is considered, the settling velocity will multiply a factor of $(1-Cs)^3$ For 100 nm or 50 nm nanoparticles, for example, the settling velocity decrease with increasing the nanoparticle volume loading concentration Cs from 10 to 60%, is shown in Table F.

TABLE F

Velocity and travel distance with nanoparticle loading for a viscosity of 2 g/cm.s

| Cs (%) | 100 nm Velocity cm/s | Travel in 1 month cm | 50 nm Velocity CPs | Travel in 1 month cm |
|---|---|---|---|---|
| 10 | 1.56735E−06 | 4.063 | 5.37639E−08 | 0.1394 |
| 20 | 1.1008E−06 | 2.853 | 8.60222E−09 | 0.0223 |
| 30 | 7.3745E−07 | 1.911 | 2.15056E−09 | 0.0056 |
| 40 | 4.644E−07 | 1.204 | 5.37639E−10 | 0.0014 |

TABLE F-continued

Velocity and travel distance with nanoparticle loading for a viscosity of 2 g/cm.s

| Cs (%) | 100 nm Velocity cm/s | Travel in 1 month cm | 50 nm Velocity CPs | Travel in 1 month cm |
|---|---|---|---|---|
| 50 | 2.6875E−07 | 0.697 | 2.15056E−11 | 0.0001 |
| 60 | 1.376E−07 | 0.357 | 0 | 0.0000 |

These results show that increasing the nanoparticle loading concentration from 10% to 40% reduces the distance traveled by the nanoparticles in 1 month by 2 orders of magnitude.

The calculated data in Table F are for a viscosity of 2 g/cm·s; in Table G are shown the data for the velocity variation the when viscosity increases to 20 g/cm·s.

TABLE G

Velocity and travel distance with nanoparticle loading for a viscosity of 20 g/cm · s

| Size nm | Density of particle (g/cubic cm) | Density of vehicle (g/cubic cm) | Viscosity (CPs) | Diameter nm | Velocity cm/s | Travel in 1 month cm |
|---|---|---|---|---|---|---|
| 100 | 8.9 | 1 | 20 | 100 | 2.15056E−07 | 0.5574 |
| 50 | 8.9 | 1 | 20 | 50 | 5.37639E−08 | 0.1394 |
| 20 | 8.9 | 1 | 20 | 20 | 8.60222E−09 | 0.0223 |
| 10 | 8.9 | 1 | 20 | 10 | 2.15056E−09 | 0.0056 |
| 5 | 8.9 | 1 | 20 | 5 | 5.37639E−10 | 0.0014 |
| 1 | 8.9 | 1 | 20 | 1 | 2.15056E−11 | 0.0001 |

Summary

1) To achieve a long term dispersion, increasing the nanoparticle volume loading concentration is a potentially useful approach.
2) It is possible to obtain a good dispersion for 50 nm nanoparticles if a high nanoparticle loading concentration is used.
3) Increasing the viscosity of the vehicle leads to a decrease in the velocity.

Metal nanoparticles can be manufactured by both wet and dry methods. The wet methods involve reduction of metal salts to the element, and dry methods involve ablation or vaporization of the element in the gas phase and condensation into metal nanoparticles (nanopowders). Metal nanoparticles prepared by both methods can be successfully formulated into conductive metallic inks. An important consideration for metal nanoparticles prepared by wet methods is that any containment salts introduced during the manufacturing method by completely removed from the metal nanoparticles by washing before they are formulated into conductive inks. Any remaining non-volatile salts will result in conductors being obtained that have higher resistivity and poorer adhesion than is desirable or acceptable.

Metallic nanoparticles can be passivated by an oxide layer on their surface. The oxide layer may have a thickness of, for example, about 1 nm to about 20 nm. Once the nanoparticles are passivated, further oxidation will occur very slowly. By using a photosintering technique, the smaller layer of copper oxides can be photoreduced into metallic copper in air and at room temperature, thereby fusing together to form copper conductors.

Example 1. Non-Ionic Polymeric Dispersants for Copper Inks

This "excluded" volume represents the space "occupied" by the flexible alkyl (or ethoxy) chain, and it is space that cannot be occupied by a second copper nanoparticle. The larger this "excluded" volume the more effective is the dispersant at keeping the copper nanoparticles separated. A second aspect of this "excluded" volume is that large values allow for low concentrations of the compound to be effective in providing a high level of coverage of the nanoparticle, and therefore a high degree of effectiveness as a dispersant.

Polymers that have been successfully used in the formulation of inks that have been subsequently cured by photonic cured to provide good conductors are Triton X-100, Triton X-15, Triton X-45, Triton QS-15, liner alkyl ether (colar Cap MA259, colar Cap MA1610), quaternized alkyl imidazoline (Cola Solv IES and Cola Solv TES), polyvinylpyrrolidone (PVP), polyvinyl alcohol, polyethylene glycol, and polysiloxanes. Solvents, such as 2-butoxyethyl acetate, Propylene glycol monomethyl ether acetate, Diethylene glycol monoethyl ether acetate, Ethylene glycol butyl ether, 2-Ethoxyethyl acetate, Ethylene Glycol Diacetate, Cyclohexanone, Cyclohexanol, 2-Ethoxyethyl acetate, Ethylene Glycol Diacetate, may be employed to formulate copper inks with copper nanoparticles. The weight percentage of dispersants may vary from 0.5% to 20%. The loading concentration of copper nanoparticles may be from 10% to up 60%. No binder materials are needed in the formulation.

The rationale behind the use of polymers as dispersants is that they often have higher viscosities than do the typical liquids used as vehicles in conductive inks, and that because of their multiple binding sites to metal nanoparticles, they can be used in lower concentrations than monomeric dispersants, and still confer monolayer coverage of the metal nanoparticle. Higher viscosities are important because they facilitate the creation of good dispersions and inks that can be printed using inkjet methods. Lower concentrations of the dispersant are favorable because there is less organic material to be removed during the curing (sintering) process.

The inks with good dispersion can be inkjet-printed, or printed by other techniques such as draw-down, spin-casting, roll-to-roll printing, flexo-printing, gravure printing, etc. on flexible substrates such as polyimide and PET. A pre-cure process is applied to the ink-coated substrates in air and at temperatures below 150° C. Then, photosintering is used to sinter copper nanoparticles into copper films in microseconds to less than 1 millisecond while at the same time copper oxide layer on copper nanoparticles is photoreduced into metallic copper, resulting in high-purity metallic copper conductors. The adhesion between copper films and substrates is excellent without using any binder materials because the heat from melting copper causes a welding effect between copper and plastics having relatively low melting points. A resistivity as low as 3.6~10 $\mu\Omega$-cm (1.7 $\mu\Omega$-cm for bulk copper) is achieved. Lasers, including continuous and pulsed lasers, may be used to sinter copper inks into copper conductor. Pulsed lasers from nanosecond to femtosecond laser may be used to sinter copper inks also.

Example 2. Ionic Polymeric Dispersants for Copper Inks

Copolymer with acidic groups is used as dispersants to formulate copper inks with compatible vehicles. Copolymers with ionic groups, such as Disperbyk 180, Disperbyk 111, styrene maleic anhydride copolymer (SMA 1440 flake), PT, HCS-P, HCS-N, etc. are of ionic character so that electrostatic dispersion can be obtained. One of compatible vehicles or their combination, such as 2-butoxyethyl acetate, Propylene glycol monomethyl ether acetate, Diethylene glycol monoethyl ether acetate, Ethylene glycol butyl ether, Cyclohexanone, Cyclohexanol, 2-Ethoxyethyl acetate, Ethylene Glycol Diacetate, terpineol, isobutyl alcohol, etc., may be employed to formulate copper inks with copper nanoparticles. The copper inks are inkjet printed on flexible substrates. Then, a pre-cure process is employed to remove as much vehicles and dispersants in air and low temperatures below 150° C. Photo-sintering is finally applied on the printed copper inks to fuse copper nanoparticles into conductors. The weight percentage of dispersants may vary from 0.5% to 20%. The loading concentration of copper nanoparticles may be from 10% to up 60%.

The inks with good dispersion may be inkjet-printed, or printed by other techniques such as draw-down, spin-casting, roll-to-roll printing, flexo-printing, gravure printing, etc. on flexible substrates such as polyimide and PET. A pre-cure process is applied to the ink-coated substrates in air and at temperatures below 150° C. Then, photosintering is used to sinter copper nanoparticles into copper films while at the same time copper oxides layer on copper nanoparticles is photoreduced into metallic copper, resulting in high-purity metallic copper conductors. The adhesion between copper films and substrates are excellent without using any binder materials because the heat from melting copper cause a welding effect between copper and plastics having relatively low melting points. A resistivity as low as 3.6~10 $\mu\Omega$-cm (1.7 $\mu\Omega$-cm for bulk copper) is achieved. Lasers, including continuous and pulsed lasers, also may be used to sinter copper inks into copper conductor. Pulsed lasers from nanosecond to femtosecond laser may be used to sinter copper inks too.

Example 3. Formulation with Both Non-Ionic and Ionic Dispersants

To obtain better dispersion, both non-ionic and ionic dispersants are used to formulate copper inks. Non-ionic dispersants such as Triton X-100, Triton X-15, Triton X-45, Triton QS-15, linear alkyl ether (colar Cap MA259, Colar Cap MA1610), quaternized alkyl imidazoline (Cola Solv IES and Cola Solv TES), polyvinylpyrrolidone (PVP), and Copolymers with ionic groups, such as Disperbyk 180, Disperbyk 111 (a composition of Phosphoric acid plus Phosphoric acid polyester), etc. may be used, as well as the, styrene maleic anhydride copolymer (SMA 1440 flake), PT, HCS-P, HCS-N, etc. to formulated with copper inks. Passivated copper nanoparticles with copper oxides are used for formulation. Compatible vehicles, such as 2-butoxyethyl acetate, Propylene glycol monomethyl ether acetate, Diethylene glycol monoethyl ether acetate, 2-Ethoxyethyl acetate, Ethylene Glycol Diacetate, Ethylene glycol butyl ether, Cyclohexanone, Cyclohexanol, etc. may be chosen to formulate copper inks with copper nanoparticles. Specifically, a combination of 2-butoxyethyl acetate and Propylene glycol monomethyl ether acetate, a combination of 2-Ethoxyethyl acetate and 2-Ethoxyethyl acetate, and a combination of Ethylene Glycol Diacetate and Propylene glycol monomethyl ether acetate, may be used as compatible with both ionic and non-ionic dispersants. The weight percentage of dispersants may vary from 0.5% to 20%. The loading concentration of copper nanoparticles may be from 10% to up 60%.

Good dispersion is obtained form these formulated copper inks. The inks can be printed by draw-down, spin-casting, roll-to-roll printing, flexo-printing, gravure printing, inkjet-printing, etc. on flexible substrates such as polyimide and PET. A pre-cure process is applied to the ink-coated substrates in air and at temperatures below 150° C. A resistivity as low as 4 µΩ-cm is obtained. Lasers, including continuous and pulsed lasers, may also be used to sinter copper inks into copper conductor. Pulsed lasers from nanosecond to femtosecond laser may be used to sinter copper inks too.

Example 4. Low Organic Residue Copper Inks

To obtain high-purity copper films with photosintering, the less organic residue will result in high conductivity. Vehicles and dispersants with low boiling points are chosen to formulate copper inks. The weight percentage of dispersants can vary from 0.5% to 20%. The loading concentration of copper nanoparticles can be from 10% to up 60%. Low boiling point alcohol or other solvents, such as isopropyl alcohol, ethanol, toluene, butylbenzene and water etc., can be used as a vehicle. Low boiling point amines with relatively low molecular weight can be used as dispersant for ink formulation, such as hexylamine, octylamine, etc. These low boiling-point vehicles and amines can be easily vaporized when a pre-cure process at low temperatures below 150° C. is applied on the coated inks. The amines should have lower boiling points below 150° C. so that most of them will be vaporized during the pre-cure process. The pre-curing step is necessary to ensure that the printed or coated metal nanoparticles are dry before they are photosintered. This step is carried out in air below 150° C. This step is necessary because if the metal nanoparticles to be photo-sintered contain compounds that are volatile, the rapid heating during the photonic curing will cause them to evaporate very quickly, a process that will cause the coated film of metal nanoparticles to become discontinuous and very rough surface is obtained.

The inks with good dispersion may be printed by draw-down, spin-casting, roll-to-roll printing, flexo-printing, gravure printing, inkjet-printing, etc. on flexible substrates such as polyimide and PET. A pre-cure process is applied to the ink-coated substrates in air and at temperatures below 150° C. With low boiling point vehicles and dispersants, high-purity copper films may be achieved by photosintering, thereby a resistivity of 3.5 µΩ-cm is obtained. Lasers, including continuous and pulsed lasers, may also be used to sinter copper inks into copper conductor. Pulsed lasers from nanosecond to femtosecond laser may be used to sinter copper inks too.

To avoid clogging printer nozzles, the diameter of the copper nanoparticles should be smaller than 1000 nanometers. The same applies to grouping of nanoparticles in which the nanoparticles are clustered together. The diameter of the agglomeration (known as the secondary particle size) also should be smaller than 1000 nanometers.

The size of the copper nanoparticles also may have an effect on the photosintered film properties. For example, in some cases, an ink having large nanoparticles can, following photosintering, have a resistivity that is substantially lower than a photosintered ink with small nanoparticles. The difference in resistivity may be attributed, in part, to copper to copper fusion and, in part, to the amount of copper oxides in the films after photosintering relative to the amount of copper oxide in the films before curing.

Making metal conductors from the fusion of metal nanoparticles involves two steps. One of these steps is the fusion of the nanoparticles together to give a fully connected metal film, and the other step is achieving fusion throughout each individual metal nanoparticle. If both of these steps are achieved, the individual metal nanoparticles will be converted into bulk metal. If both steps are not achieved, the metal will have a higher resistivity than bulk metal because there will be holes in the conductor where fusion between nanoparticles has not occurred; and, if complete fusion throughout each individual metal nanoparticle has not occurred, the profile of the metal conductor will not be smooth, but instead will still show the profiles of the individual metal nanoparticles. Both of these steps are influenced by the size and size distribution of the metal nanoparticles used to make the metal conductor.

Several factors are dependent on the size of the metal nanoparticles used to generate the metallic conductors. As the size of the metal nanoparticle is decreased, its reactivity is increased, and its melting point is decreased. Both of these factors favor the sintering of the metal nanoparticles into a fused metallic conductor. The conversion of individual metal nanoparticles into a completely fused metal conductor requires that each metal nanoparticle is fused together into a continuous array of crystalline copper atoms. The number of connections that must be made to accomplish this depends on the size of the metal nanoparticles. Although smaller metal nanoparticles have a lower melting point and are more reactive, more connections should be made in order to create a continuous metal conductor. The fusion of metal nanoparticles into a continuous metal conductor is a balance between the advantage of the small metal nanoparticles having a lower melting point and being more reactive, and the larger metal nanoparticles requiring fewer connections to be made during the sintering (curing process).

The balance between these two factors has been investigated using copper nanoparticles having a range of different sizes. These range from 30 nanometer size to over 100 nanometer in size. Each size of copper nanoparticle was formulated into an ink which was coated, pre-cured, and photosintered in air. The results show that for the nm, 50 nm, 80 nm and 120 nm size range, the lowest resistivity is obtained with the 80 nm size copper nanoparticles.

Figure 12:
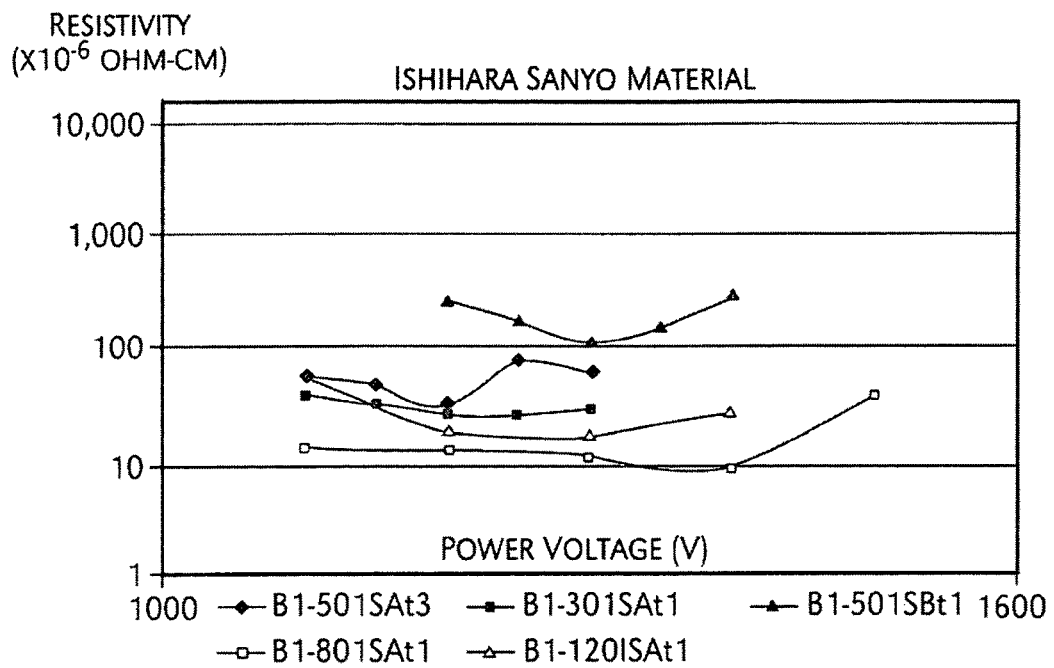
FIG. 12 is a graph of resistivity data for pretreated ink prepared from different sizes of copper nanoparticles.

Referring to FIG. 12, a set of copper nanoparticles of different sizes were obtained. These nanoparticles had sizes of 30 nm, 50 nm, 80 nm and 120 nm, and coated with a protectant. Inks were prepared from each of these samples. In order to prepare consistent formulations for direct comparison, the pretreatment involved using a mixture of 1-hexylamine (2 mL) and isopropyl alcohol (4 mL) followed by the subsequent addition of isopropyl alcohol (10 mL). The two different batches of 50 nm size copper nanoparticles were designated as A and B. The resistivities obtained after carrying out the coating, precuring, and photonic curing are shown in FIG. 12.

Figure 13:
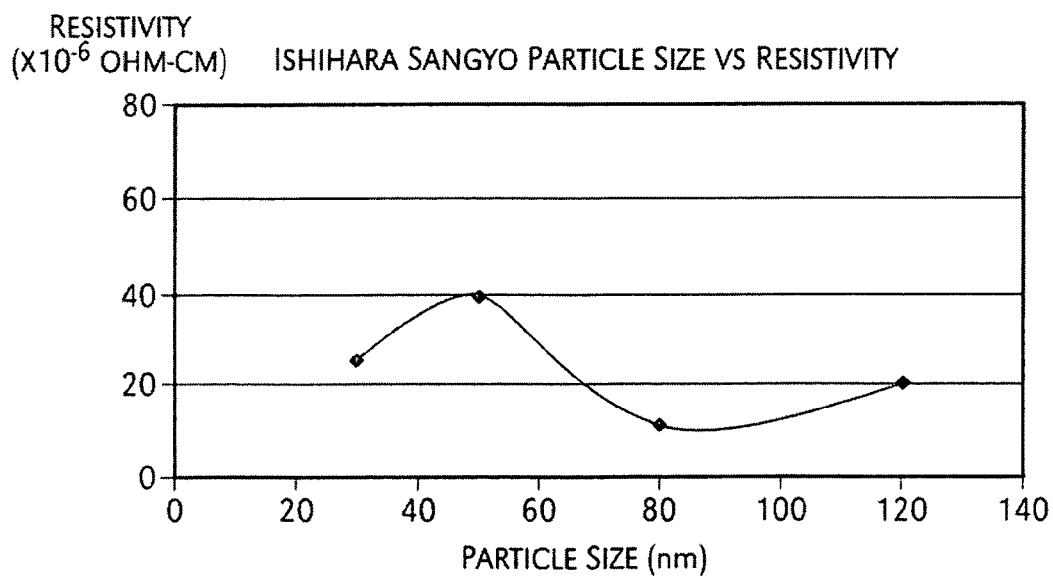
FIG. 13 is a graph of resistivity versus particle size for pretreated ink prepared from different sizes of copper nanoparticles.
Figure 14:
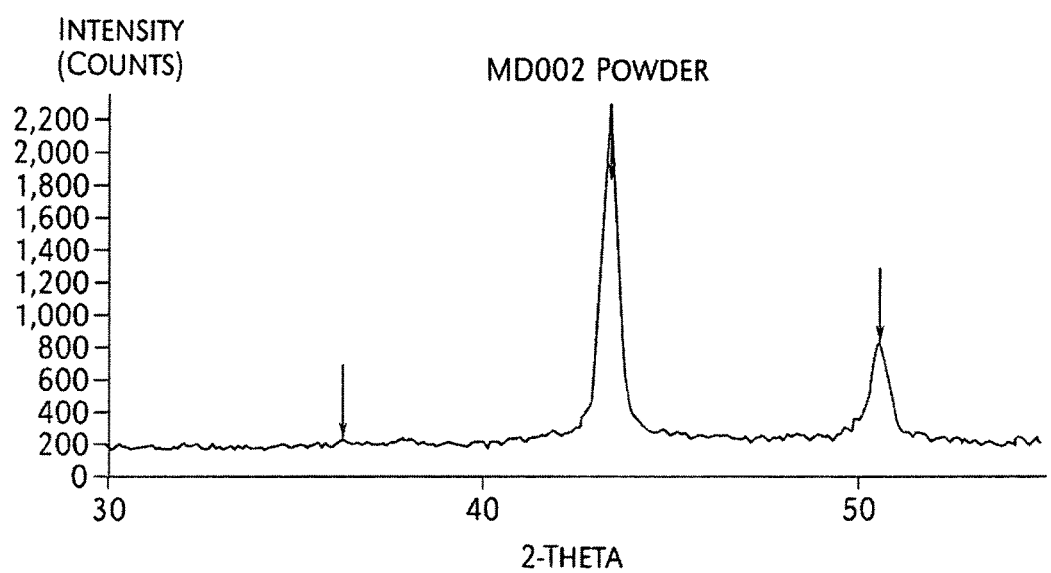
FIGS. 14-17 are x-ray diffraction graphs of different sizes of copper nanoparticles.
Figure 15:
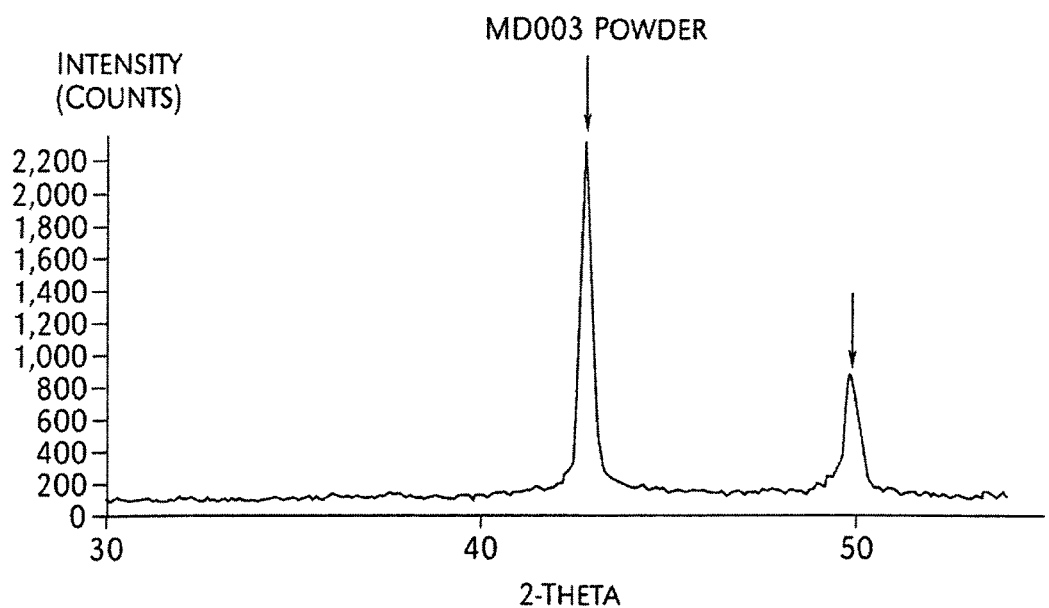
Figure 16:
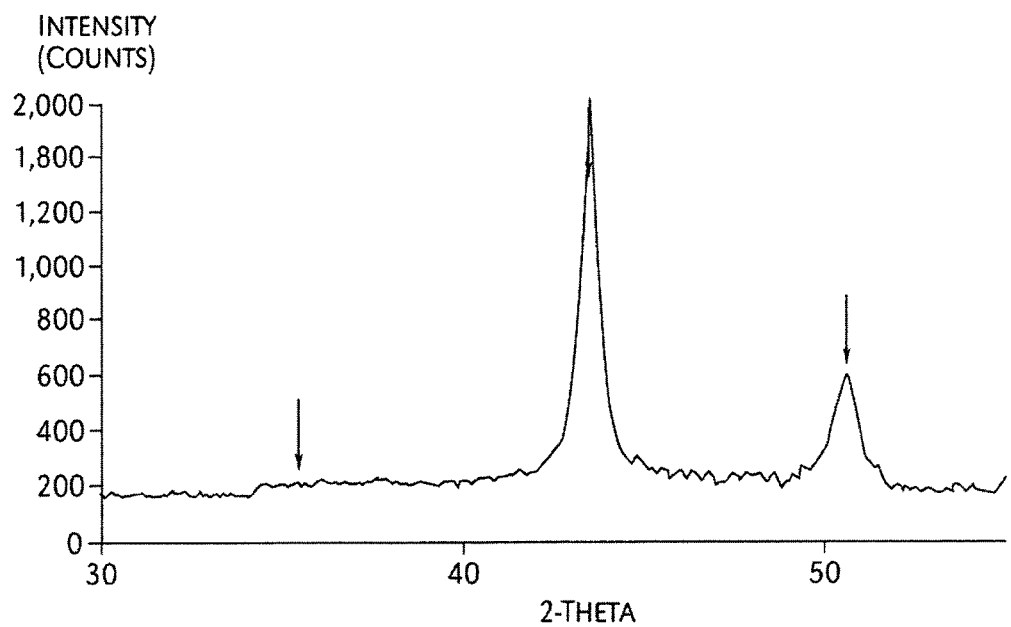
Figure 17:
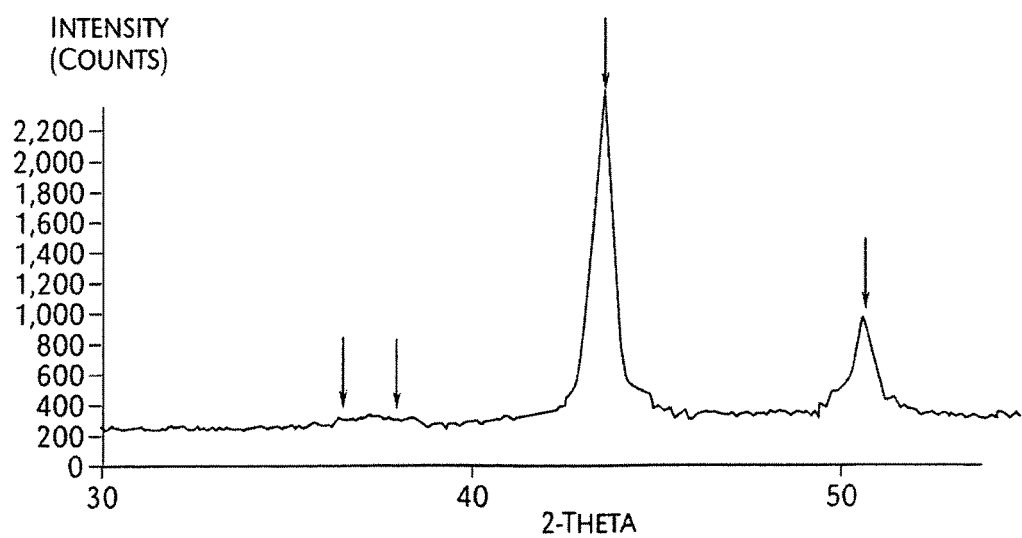

These data show that the resistivity follow the sequence 80 nm<120 nm<30 nm<50 nm as shown in FIG. 13.

The XRD's (x-ray diffraction graphs) were obtained on these copper particles as delivered and before any processing in order to determine whether the resistivity sequence shows any correlation with oxide content. The respective XRD's for the 80 nm, 120 nm, 30 nm and 50 nm samples are shown in FIGS. 14-17, respectively.

Figure 26:
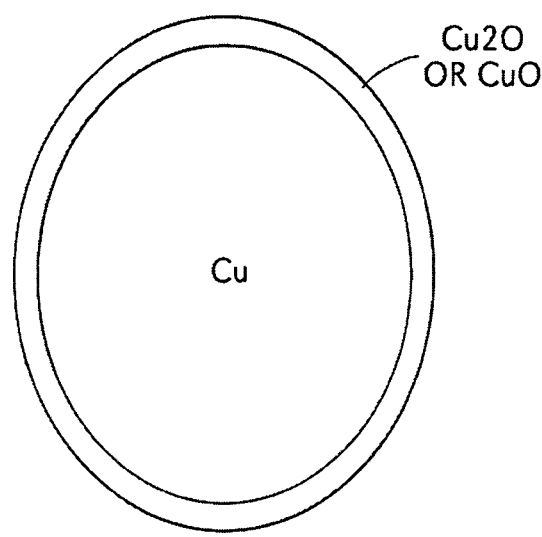
FIG. 26 illustrates a copper nanoparticle with a copper oxide as a passivation layer.

The XRD's of the different size copper nanoparticles do not show any significant differences in the amount of copper oxide that is present on the nanoparticles. In each case, the amount of oxide is small. It is unlikely therefore that the difference in resistivity of the cured conductor with variation in copper nanoparticle size is caused by differences in copper oxide content. In forming conductors from metal nanoparticles two considerations are to be taken into account. As the nanoparticles become smaller they become more reactive, and their sintering to a copper conductor is more favorable. Nevertheless, the smaller nanoparticles need to form more connections in order to form a continuous conductor, and this is a disadvantage of using smaller nanoparticles. An advantage of the 80 nm copper nanoparticles is that it may be the point at which these two considerations maximize. There is no linear correlation between the copper nanoparticle size and the resistivity of the conductor that is formed. Referring to FIG. 26, copper nanoparticles contain copper oxides (mainly $Cu_2O$, as a passivation layer), but the concentration should not be over 30%. The shape of the nanoparticles may be spherical, oval or other irregular shapes.

Figure 2A:
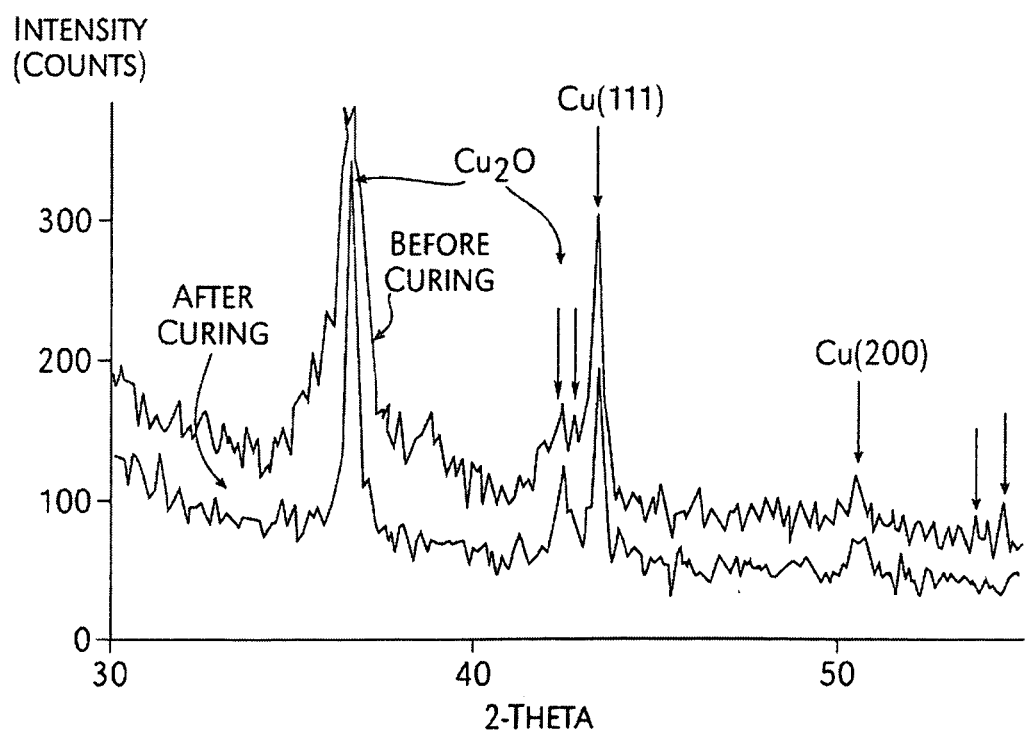
FIG. 2A is an x-ray diffraction graph.
Figure 3A:
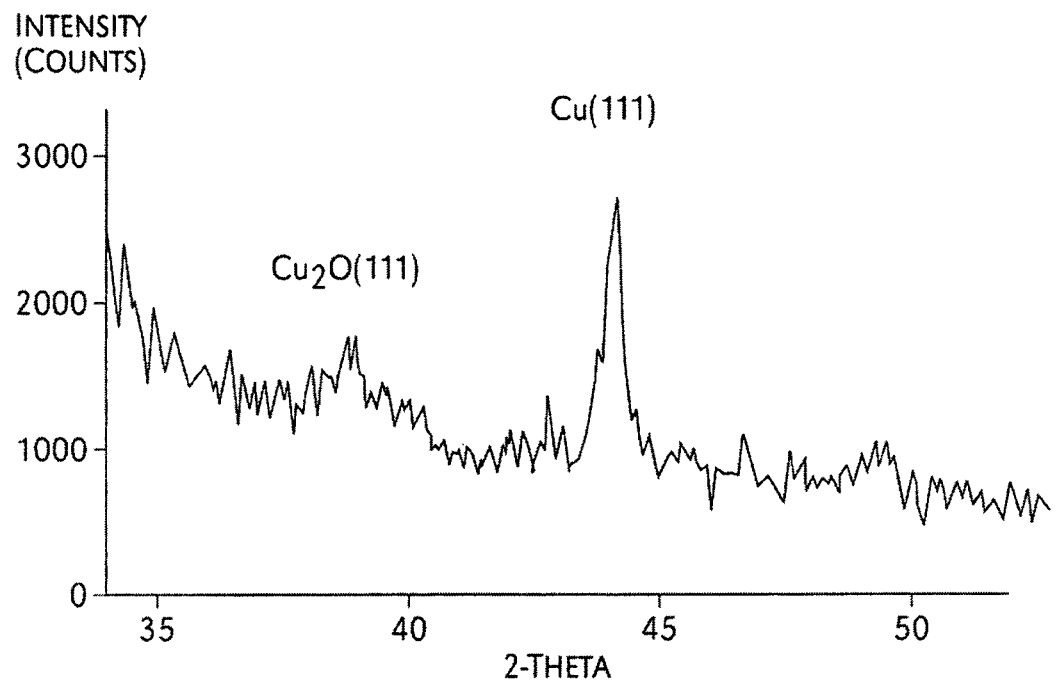
FIGS. 3A-3B are x-ray diffraction graphs.
Figure 3B:
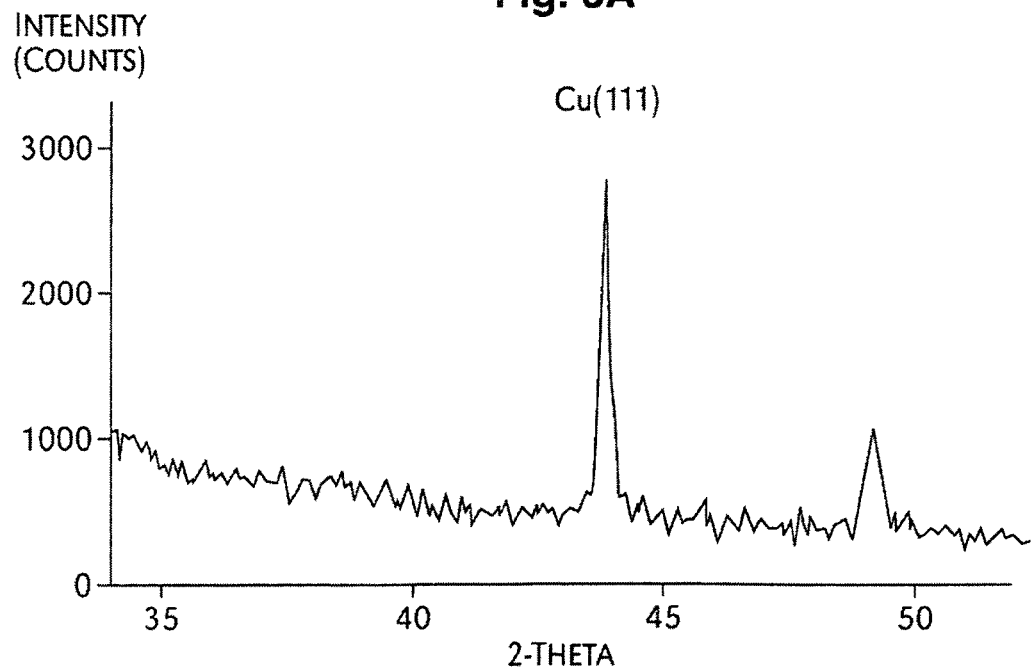
Figure 19:
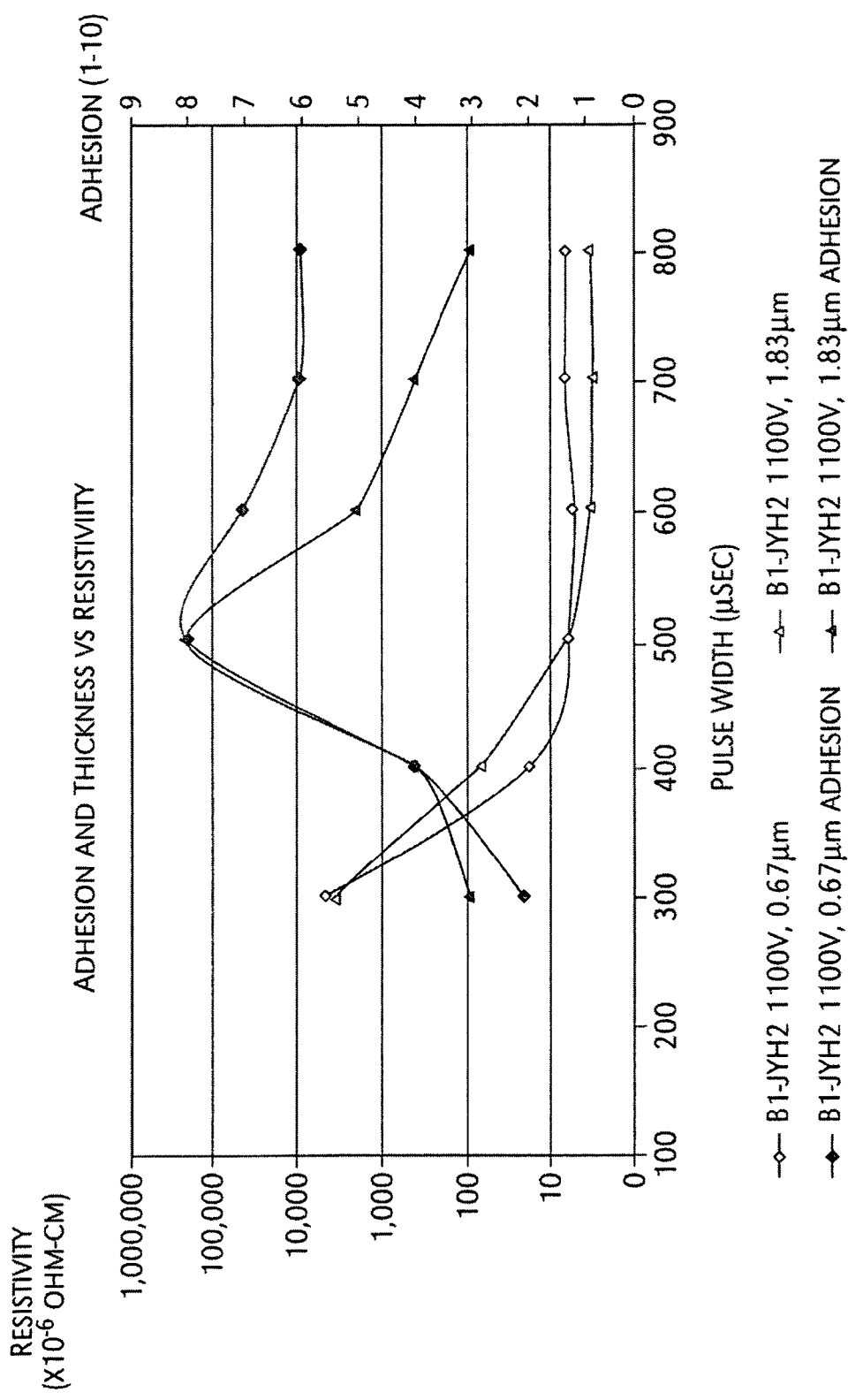
FIG. 19 is a graph of adhesion and thickness versus resistivity.

The photosintering process involves a single high intensity pulse of light. This light energy is absorbed by the metal nanoparticles where it is converted into heat. This heat energy sinters the metal nanoparticles into a coherent metal conductor and causes adhesion of the metal conductor to the substrate. These two procedures can be maximized by changing the intensity of the light pulse (by changing the voltage delivered to the lamp) or the pulse width. The entire process involves fusion of the metal nanoparticles throughout the film so that all of the particles are sintered into a metallic conductor, and that the bottom layer of the metallic conductor is fused into the substrate to achieve good adhesion both within the conductor and between the metal conductor and the substrate. If the substrate has a sufficiently low melting point, direct adhesion between the metallic conductor and the substrate can be achieved. If the substrate does not directly adhere to the metallic conductor an adhesion promoter can be used between the substrate and the metallic conductor. By controlling the intensity and pulse width of the light flash it is possible to achieve sintering of the metal nanoparticles into a metallic conductor, and adhesion to the substrate without causing any damage to the substrate that will lead to a change in any of its physical properties. FIG. 19 shows the effect of both energy light flash voltage and pulse width on both the resistivity and adhesion of copper formed by the photosintering of copper nanoparticles on a flexible substrate. By choosing the correct combination of voltage and pulse width, both a low resistivity and a high adhesion can be achieved. Particle coating thicknesses of 0.1 to 10 microns are photosintered with energies optimized in a range of 0.1 to 20 joules/cm². The resistivity against photosintering energy plot has a parabolic shape with the minimum resistivity occurring between the partially sintered and blown off regions. Within the energy range of 0.1 to 20 joules/cm² a flatter parabola is desired, and the metallic ink is formulated to achieve this photosintering profile. During the photosintering process, the surfaces of flexible substrates become textured, which improves the adhesion. Any curling of the flexible substrate can be minimized by heating the surface. FIG. 2A is a graph depicting x-ray diffraction (XRD) of a film containing 20 nanometer copper nanoparticles before and after the photosintering process. As seen from that graph, the content of CuO in the film after photosintering is essentially eliminated, whereas the content of $Cu_2O$ is not considerably changed This is shown by the narrowing of the $Cu_2O$ line at low 2-theta. For larger particles, however, the content of $Cu_2O$ may also be reduced. For example, FIGS. 3A and 3B show XRD graphs of inkjetted metal films that include 50 nanometer copper particles before and after photosintering the films, respectively. The presence of copper oxide in the form of $Cu_2O$ in the 50 nm particle film before photosintering is 28%. In contrast, the presence of copper oxide in the form of $Cu_2O$ in the film after photosintering is approximately 7%, which corresponds to a $Cu/Cu_2O$ ratio of 13:1. Relative $Cu_2O$ content in films that include 100 nanometer copper particles is even smaller after photosintering leading to further decreases in resistivity. Additionally, 100 nanometer films also have lower content of CuO material before and after photosintering.

Figure 2B:
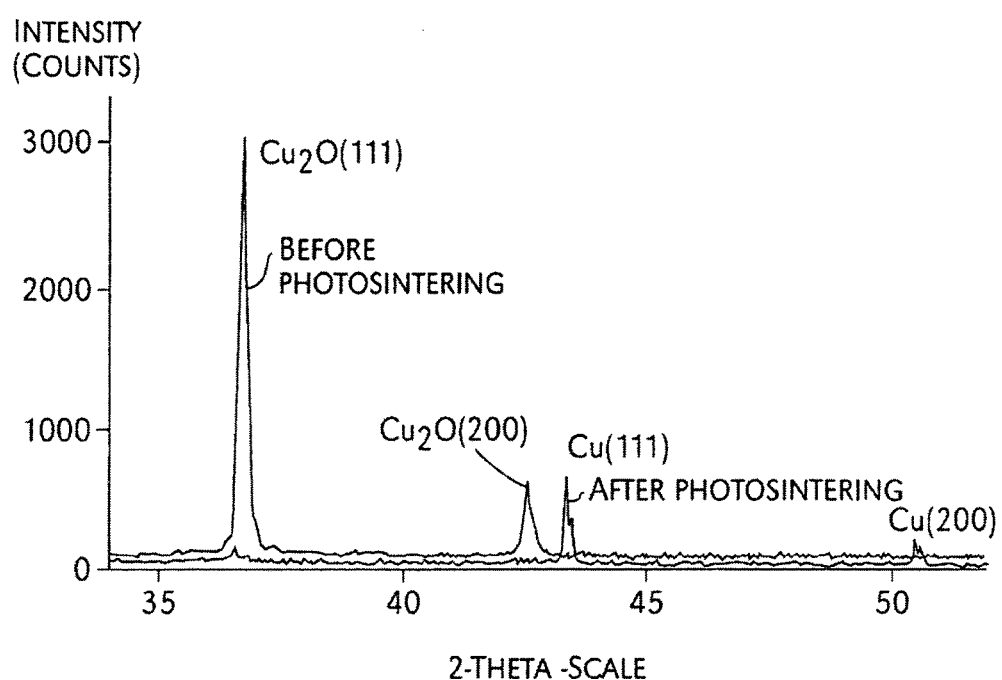
FIG. 2B is a graph of XRD patterns of pure copper oxide film before and after photosintering.

The CuO is removed during photosintering by a process of reduction in which the CuO is transformed to copper and $Cu_2O$. For films with smaller nanoparticles, e.g., nanoparticles having a diameter of approximately 20 nm, the content of $Cu_2O$ stays essentially the same as before photosintering. During the process of fusion between copper nanoparticles, the $Cu_2O$ material is eliminated in large part from the fusion points between particles and is pushed out towards the periphery of the fused area. In addition, the crystallographic structure at the interface between copper particles affects the conductivity of the photosintered ink. High conductivity is observed due to effective blockage of dislocations at copper particle boundaries. Examination of the crystallographic structure of CuO and $Cu_2O$ reveals that CuO is typically monoclinic whereas $Cu_2O$ is cubic. Accordingly, a boundary between two cubic structures (as in $Cu_2O$) is likely to have fewer dislocations than a structure in which the boundary includes dissimilar crystallographic structures (as in CuO). Therefore, the reduction in resistivity can be partially attributed to the elimination of CuO as shown in the 20 nm ink formulations. Pure cuprous copper oxide ($Cu_2O$, 99% purity) is used to formulate a solution with IPA and hexylamine. The size of the $Cu_2O$ powders is from a few micrometers to about 20 micrometers estimating by optical microscopy. A drop-deposition is used to coat the solution on polyimide to form a continuous film and the thickness of the film is not uniform. The film is exposed by a flash lamp. XRD is used to check the exposed zone and non-exposed zones. Non-exposed zones show a clear characteristic XRD pattern of $Cu_2O$, as shown in FIG. 2B. The exposed zones show strong metallic copper peaks at 43.4° and 50.5° in FIG. 2B. The exposed zone with a conversion of copper oxide to copper, which is confirmed by XRD, is actually conductive. The resistivity is about $3.7 \times 10^4$ Ω·cm.

The reduction of some oxides under photosintering may occur based on the energy band gap of the oxides, the enthalpy of formation of the oxides and the radiation energy applied during photosintering. For example, the band gap for $Cu_2O$ and CuO are 1.9 eV (188 kJ/mol) and 2.6 eV (257 kJ/mol), respectively. The corresponding enthalpies of formation of $Cu_2O$ and CuO are 157 kJ/mol and 168 kJ/mol respectively. Thus, UV radiation in the wavelength range of approximately 100 nm to 400 nm can reduce $Cu_2O$ to metallic copper, wherein the reduction involves an electron transfer from the copper oxide to the metallic copper being formed. The photosintering process precludes oxidation of interfaces between the copper nanoparticles.

Even if inkjettable copper solutions have little or no copper oxide content, the copper oxides may be introduced into the film during pre-curing as a result of exposing the film to elevated temperatures. For example, films containing 20 nm particles that are pre-cured in air may have a resistivity that is one order of magnitude more than 20 nm films that are pre-cured in forming gas. The generation of $Cu_2O$ during the pre-curing in air leads to the higher resistivity.

Figure 27:
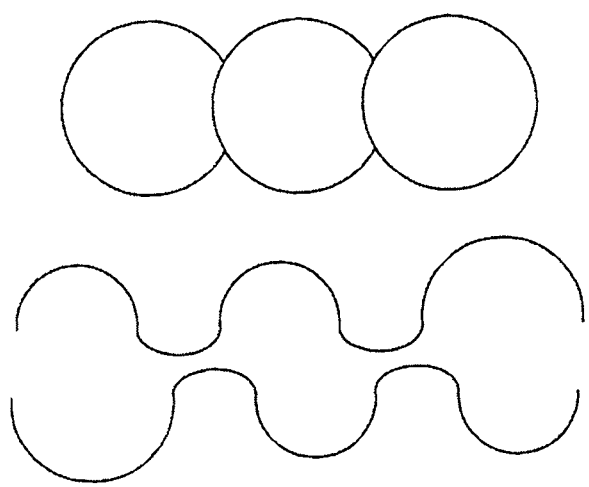
FIG. 27 illustrates the formation of fusion points formed during photosintering leading to granularity in the films.

Furthermore, films with smaller nanoparticles will have a greater number of fusion points per unit length. Accordingly, as the fusion points are not zero in resistance, photosintered films with smaller nanoparticles will have a higher resistivity. Therefore, the resistivity of photosintered films formed using 100 nm particles will be lower than photosintered films formed using 50 nm particles which, in turn, will have lower resistivity than photosintered films using 20 nm particles. The granularity of the films due to the nanoparticles can be seen even after photosintering. FIG. 27 shows the formation of fusion points formed during photosintering leading to granularity in the films. The generation of conductive metallic films from coatings of metal nanoparticles requires the generation of a large number of connections between the individual nanoparticles. Furthermore, if the conductor is to approach that of the pure metallic state, fusion needs to occur not only between metallic nanoparticles, but also throughout the individual nanoparticles themselves. A consequence of this entire process is an increase in density from that of the metal nanoparticle powder to that approaching that of the bulk metal. This will lead to a shrinkage. Since the photosintering process is very rapid, it is unlikely that complete conversion from an array of metal nanoparticles into the bulk metal occurs. As a result, not all nanoparticles will have fusion points around their entire perimeter or throughout their entire volume. Thus the photosintered conductor will still retain some of the shape profile of the original metal nanoparticles rather than being having the morphology of a smooth metallic surface.

Additional factors also affect the resistivity of the inkjetted copper films with respect to the photosintering process. For example, as the thickness of the initially deposited copper film increases, more incident photo-energy is needed to obtain the same resistivity as thinner films. If the layer is too thick, light will not penetrate completely though the metal particle film. Accordingly, the layer will not completely photosinter. An incomplete photosintering process leads to films with higher resistivity and poor substrate adhesion. A typical thickness of deposited nanoparticle ink prior to sintering is in the range of 0.5 to 10 microns.

Figure 4:
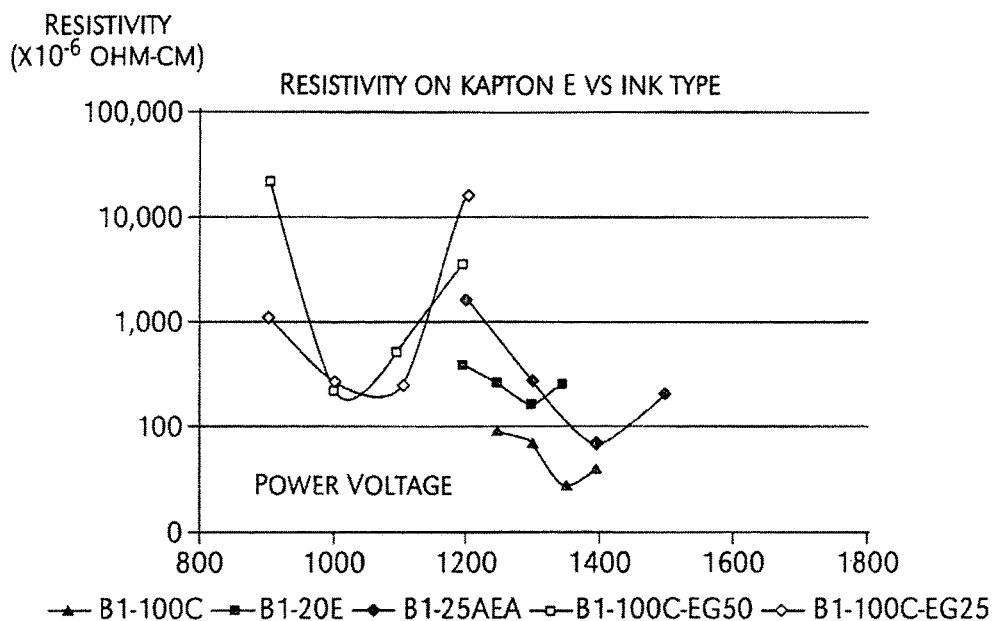
FIG. 4 is a graph depicting film resistivity versus flash lamp or photosintering voltage for different ink formulations.
Figure 5:
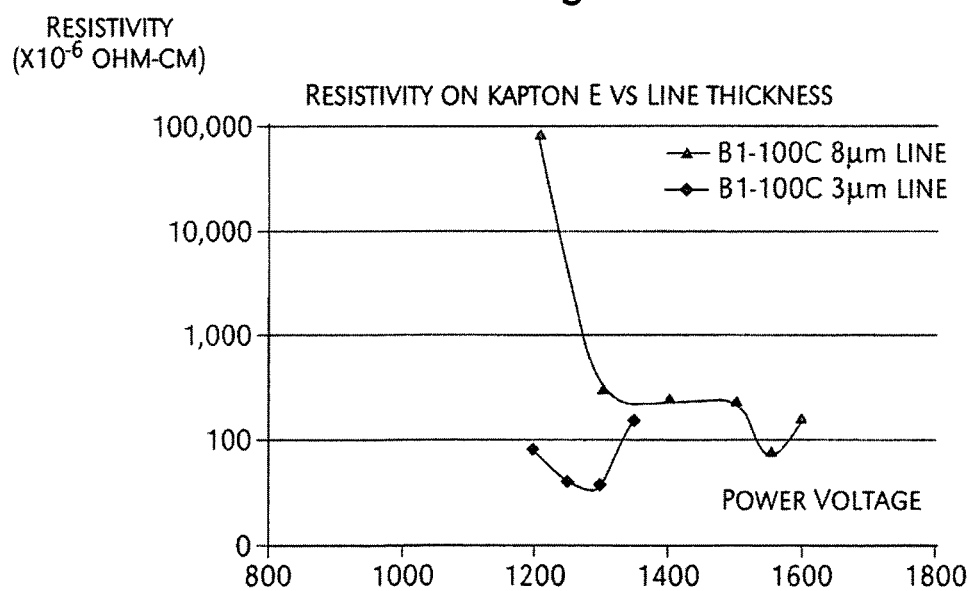
FIG. 5 is a graph depicting film resistivity versus flash lamp voltage for different line thicknesses.

There are a number of variables that affect the optimal amount of energy used in the photosintering process. For example, inkjettable copper inks may have different formulations, where the formulation is the chemical composition of the liquid mixture and the percentage of copper nanoparticles added to this liquid mixture. Depending on the formulation and the substrate used, the minimum resistivity may occur at different photosintering flux intensities—or power. FIG. 4 illustrates resistivity versus voltage (as applied to a photosintering lamp) for various ink formulations on a Kapton® substrate. This variation in photo-flux intensities occurs in part due to the ink formulation and nanoparticle size, which affect the particle fusion process such that certain inks require more incident photo-flux intensity to induce fusion than other inks Furthermore, depending on the energy applied, copper particle ablation and substrate damage can occur. When these variables are taken into consideration, an optimal photosintering photo-flux intensity may be determined corresponding to the bottom of the parabolas shown in FIG. 4. As the thickness of the ink layer increases, the ablation effects are smaller. As a result, a wider range of flux intensities may be provided by the photosintering lamp to obtain the lowest resistivity for a particular ink formulation (see FIG. 5). In some cases, if the incident photo-flux intensity is too high or the nanoparticle film is too thin, discontinuities also can form in the photosintered film, leading to an increase in film resistance.

The photo-flux intensity and energy spectrum from the lamp, used for photosintering can be further optimized based on the ink deposition area. For example, ink deposited in traces that are well defined and localized may require less photo-intensity than ink deposited over large areas of a substrate. Accordingly, less photo-intensity may be necessary to photosinter small features than entire films of copper-ink.

Figure 6:
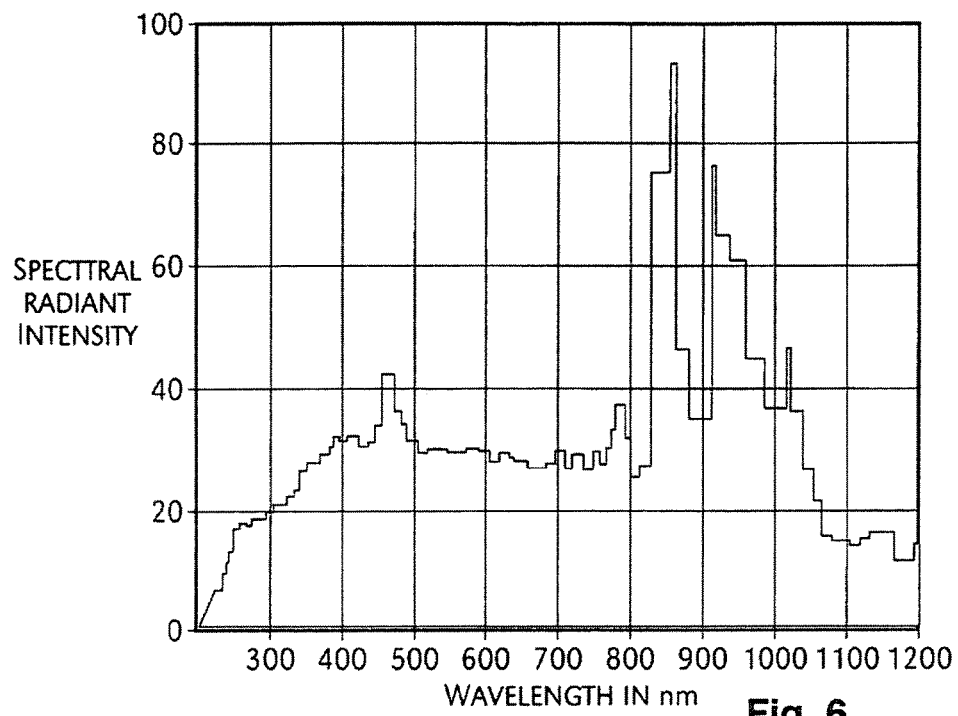
FIG. 6 is a graph depicting spectral radiant intensity of a xenon lamp.

Typically, the power emitted in the form of UV radiation (below about 380 nm) is approximately 6% of the total power emitted from a xenon lamp. For example, FIG. 6 shows a spectral radiant intensity versus wavelength emitted from a NovaCentrix™ flash lamp. An alternative to xenon lamps includes excimer UV and vacuum UV lamps or lasers that contain decaying excimer complexes. An excimer laser typically uses a combination of an inert gas (argon, krypton, or xenon) and a reactive gas (fluorine or chlorine). Under the appropriate conditions of electrical stimulation, a pseudo-molecule called a dimer is created, which can only exist in an energized state and can give rise to laser light in the ultraviolet range. The use of excimers offers several advantages. For example, in some cases, the decaying excimer complexes are suitable for photonic curing lamps that fuse and photo-reduce copper oxides at the same time. In some instances, excimer lamps give off high-intensity narrow band radiation at various UV wavelengths. In many cases, excimer forming gas mixtures exhibit a single dominant narrow emission band. Additionally, excimers are efficient energy converters that transform electron kinetic energy into UV radiation and excimers typically do not exhibit self-absorption. Excimer systems can be pumped at extremely high power densities before saturation effects start to limit the spontaneous emission. Accordingly, extremely bright UV and vacuum UV sources can be built with spectral outputs that are optimized for absorbing light energy into the metal particle film.

In some cases, additives can be included in the ink formulations in order to adjust the ink viscosity, surface energy, light heat capacity and energy absorbance, among others. Inks having lower viscosities and surface tensions tend to spread quicker and easier on substrate surfaces whereas higher viscosities and surface tension may allow for greater control of liquid spreading. An example of an additive that alters ink viscosity and surface tension is ethylene glycol. The viscosity of inkjettable copper inks should be less than 20 centipoise and preferably between 8 and 20 centipoise. Surface tension should be less than 60 $dynes/cm^2$ and preferably between 20 and 60 $dynes/cm^2$.

In some instances, the resistivity of the inks as deposited changes as a function of the amount of additive. For example, when ethylene glycol is used as an additive, the ink resistivity increases with an increasing amount of ethylene glycol. Preferably, the present volume of ethylene glycol in any ink formulation should be less than 10%.

Figure 7:
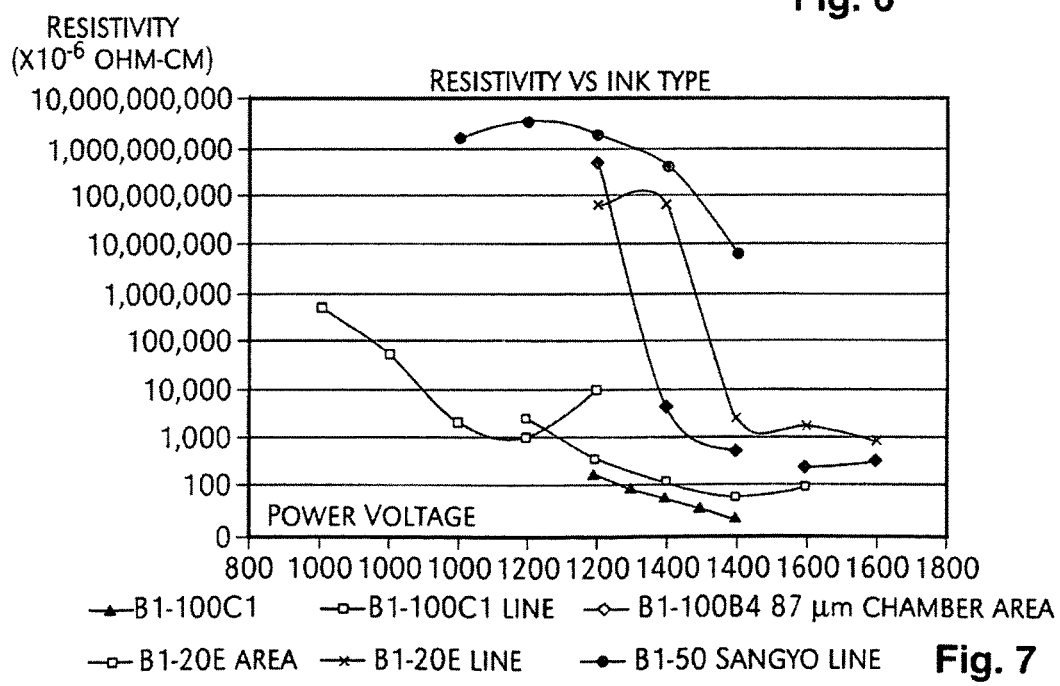
FIG. 7 is a graph depicting film resistivity versus flash lamp voltage for different ink formulations.

In some implementations, the conductive particles in the ink agglomerate to sizes that are too large to fit in the ink nozzle. To maintain smaller particle size, the large agglomerations can be fragmented by mechanical means. For example, a ball milling process can be used to reduce the size of large particle agglomerations. As shown in FIG. 7, the microfluidizing or ball milling process can lower the resistivity for different ink formulations that have been photosintered (this is shown for the B1-100B4 ink that has been microfluidized).

To fabricate flexible electronics, the nanoparticle ink is deposited on flexible substrates such as polyimides or polyethylenes. An example of a polyimide substrate suitable for inkjet deposition is DuPont's Kapton® material. Subsequent to the photosintering, Kapton® and other polyimide substrates do not provide adhesion to copper. In some cases, the polyimide surface is textured during the photosintering process without damaging the substrate. In addition, polyimides typically exhibit an increase in adhesion of the ink to the substrate during photosintering.

In some implementations, flexible substrates may curl subsequent to photosintering. The curling is a result of a mismatch between the thermal properties of the copper and the flexible substrate during the photosintering process. The curling effect can be compensated or reduced by increasing the thickness of the flexible substrate, modifying the thickness of the copper layer, or printing and curing a compensating layer on the back side of the substrate. Additionally, the curling effect can be reduced by forming copper traces on the substrate prior to photosintering instead of depositing a one or more continuous large area films on the substrate surface. The curling effect may be further reduced by warming the substrate during the photosintering process.

Figure 8A:
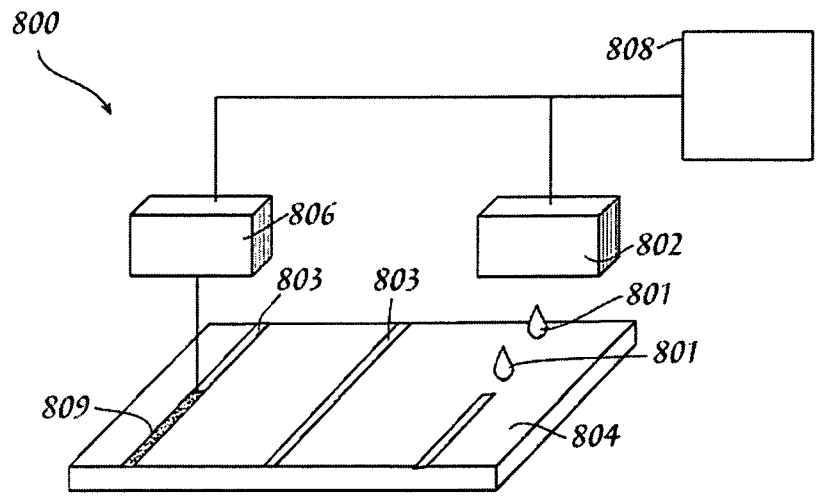
FIG. 8A illustrates a system for inkjetting and photosintering of nanoparticle films.

Referring to FIG. 8A, a device 800 is shown for simultaneous or near-simultaneous inkjetting and photosintering of nanoparticle copper films. The device includes an inkjet dispenser 802 for dispensing copper ink 801 onto the surface of a substrate 804. The device 800 also includes a light source 806 for curing the ink films 803 deposited by the inkjet dispenser 802. The light source can be a laser source (pulsed or continuous), a pulsed lamp, or a focused beam. In some implementations, the dispenser 802 is arranged to automatically pass over the substrate along a predetermined pathway. Additionally, the dispenser 802 can be arranged to dispense the copper ink at multiple predetermined positions and times above the substrate 804. The light source 806 can be attached to the inkjet dispenser 802 or arranged to travel over the substrate 800 separately from the dispenser 802. The light source 806 can be arranged to photosinter the inkjetted films immediately after they are deposited by the dispenser 802. Alternatively, the light source 806 can be arranged to photosinter the films at predetermined times following the deposition of the film in order to allow the ink to dry before photosintering. The motion of the light source 806 and the dispenser 802 can be controlled by a computer system/controller arrangement 808. A user may program the computer 808 such that the controller automatically translates the dispenser 802 and light source 806 over a predetermined path. In some implementations, the light source 806 and dispenser 802 are fixed and the substrate is placed on a movable platform controlled by the computer/controller 808.

Figure 8B:
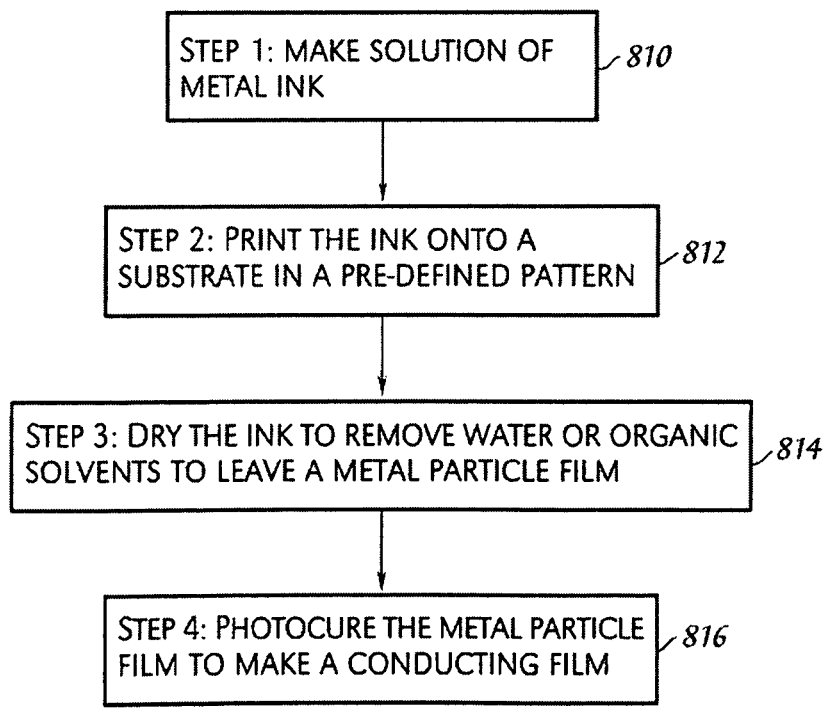
FIG. 8B is a flow chart depicting a photosintering process.

A flow chart of the photosintering process is shown in FIG. 8B. A solution of metal ink is mixed (810) and then printed or dispensed (812) onto the substrate 804 using the dispenser 802. The film deposition is tightly controlled so a well-defined pattern is formed. The film then is dried (814) to eliminate water or solvents.

In some cases, a thermal curing step may be introduced subsequent to dispensing the film and prior to the photosintering step. The substrate and deposited film can be cured using an oven or by placing the substrate on the surface of a heater, such as a hot plate. For example, in some implementations, the film is pre-cured in air at 100° C. for 30 minutes before photosintering. Alternatively, the thermal curing can be performed by directing a laser onto the surface of the film. Following the drying and/or thermal curing step, a laser beam or focused light from the light source 806 is directed (816) onto the surface of the film in a process known as direct writing. The light serves to photosinter the film such that it has low resistivity. Generally, the metal films are insulating after the printing/dispensing and drying steps. After the photosintering process, however, the insulating film becomes a conductive film 809 (see FIG. 8A).

In some implementations, the dispenser 802 is used to deposit a blanket film or a coarse outline of the pattern. Typically, printing techniques can achieve feature sizes on the order of 10-50 microns or greater. If finer features are necessary, the pattern/blanket film can be refined or reduced using a focused beam of light or laser, in which case the features are defined by the spot size of the laser or by the focus of the light beam. Typically, light can be focused to 1 micron or less. Thus, submicron features may be possible. Ultimately, the feature size is limited by the size of the nanoparticles used in the conductive film. Metal particles can be formed to have features on the order of 1-5 nm.

FIG. 9A show an example of printing a nanoparticle film in a coarse pattern outline 805 and then subsequently refining the pattern 805 using photosintering. The metal lines of the pattern 805 are first formed by printing the nanoparticle ink solution on a substrate 804 using standard printing techniques. The ink then is dried. The width of the lines in FIG. 9A is approximately 50 microns. Both a top view and edge view are shown in FIG. 9A. The printed lines 805 then are at least partially photosintered with a laser beam or other focused light source 806. The exposure time can be on the order of 500 ms or less. The photosintered regions are depicted by the cross-hatched regions. Mirrors 807 and other optics, as well as movable tables and optics, allow the light source 806 to scan across the substrate 804 to form a specific image.

Figure 9B:
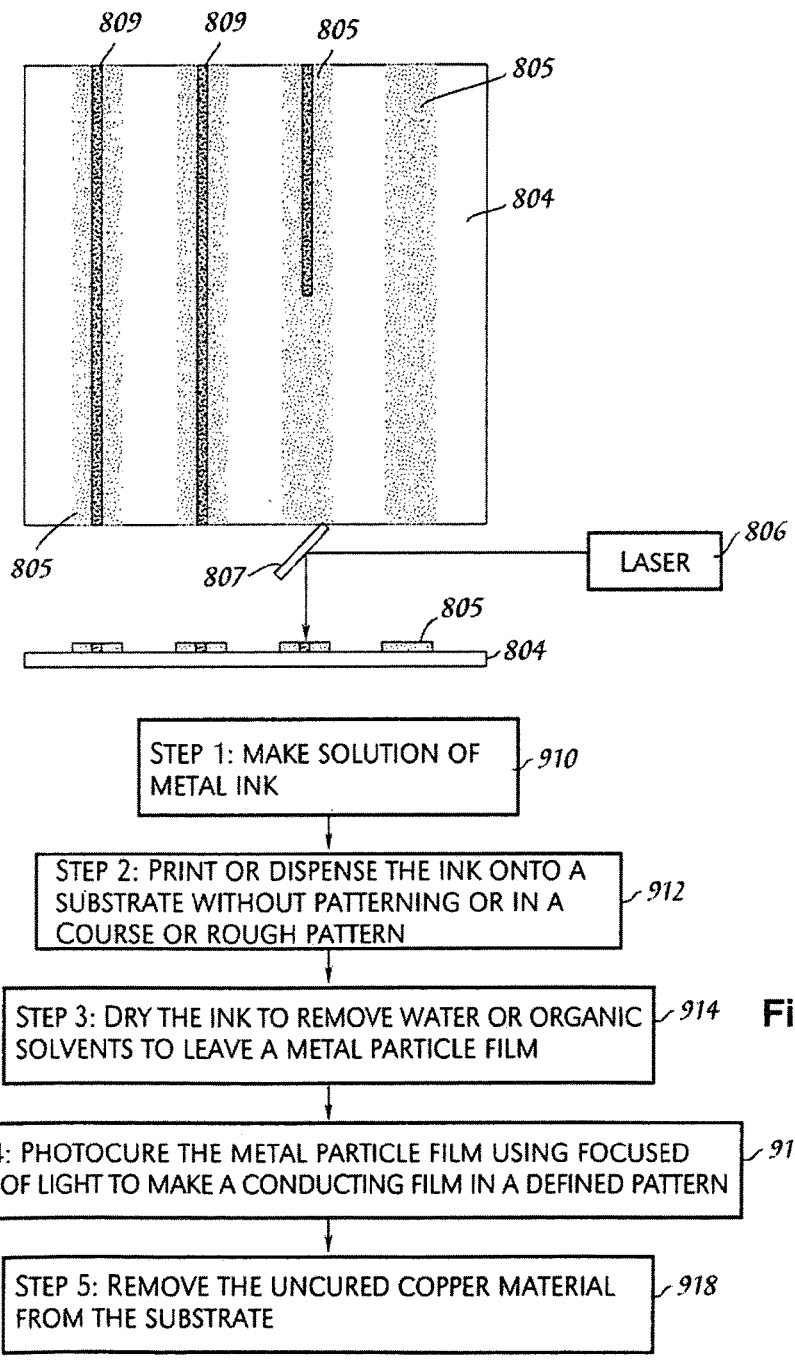
FIG. 9B is a flow chart depicting a photosintering process.
Figure 10A:
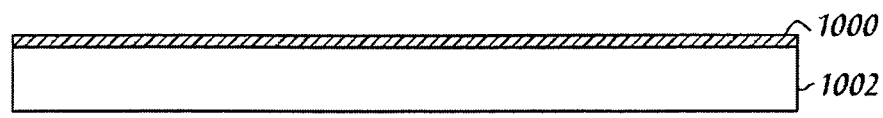
FIGS. 10A-10D illustrate a process of photosintering a nanoparticle film using a hard mask.
Figure 10B:
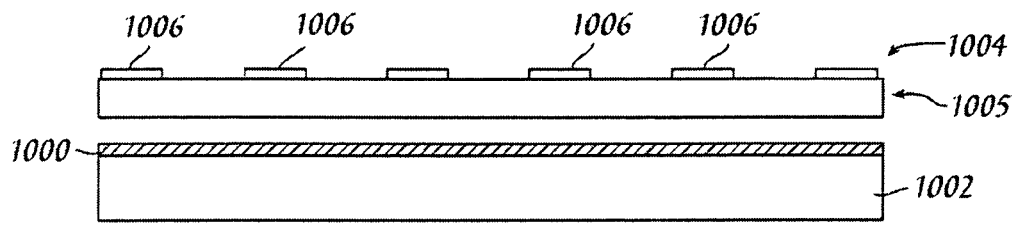
Figure 10C:
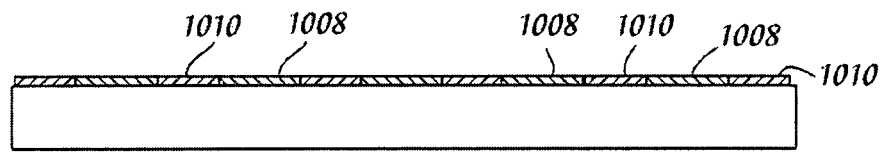
Figure 10D:
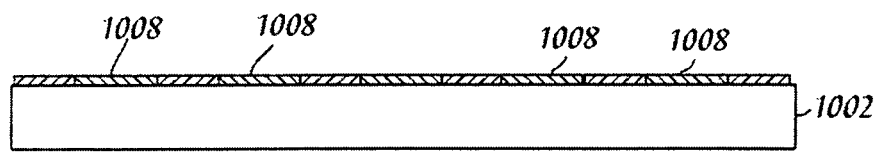

A flow chart of the photosintering process of FIG. 9A is shown in FIG. 9B. A solution of metal ink is mixed (910) and then printed or dispensed (912) onto the substrate 804 without patterning as a blanket film or in a course outline of a pattern using the dispenser 802. The film then is dried (914) to eliminate water or solvents. Following the drying and/or thermal curing step, a laser beam or focused light from the light source 806 is directed (916) onto the surface of the film. The metal film that is not exposed to the laser or focused beam is generally loosely bonded to the substrate 804 and can be removed (918) by washing the substrate. In some cases, the non-photosintered film can be removed by applying an adhesive tape to the film surface and then removing the tape. The excess ink or metal powder that is not used in the process can be recycled back to make more ink. Alternatively, given that the non-cured regions are insulating, the non-cured portions of the film can be left on the substrate.

By photosintering the deposited film with a laser 806, well-defined copper traces can be formed in air on the substrate surface while using low energy. Furthermore, laser photosintering reduces damage to areas of the substrate that do not have ink films on them. In some cases, the photosintering is achieved using a focused beam of light instead of a laser. The direct writing approach allows the pattern to be changed for each subsequent substrate that is used. In addition, given that the patterning step is near the end of the process, the substrates can be fabricated and retained on the bed that holds the printed sample prior to laser photosintering until they are needed at a later time.

It has been noted that the photosintering process can take place in an air environment, whether using a laser, focus beam of light or flash-lamp. An inert gas environment may also be used. In addition, a reactive gas environment may also be used. A reactive gas environment is a gas that contains one or more elements that create a chemical reaction before and/or after the photosintering process step.

Due to the small spot size of laser beams, laser photosintering over large areas is a time consuming process which can lead to low throughput in manufacturing. In contrast, short pulsed lamps can be used to quickly photosinter large samples that are blanketed with nanoparticle film. The desired patterns are transferred to the sample using hard masks. Fine patterns with feature sizes less than 25 microns can be achieved using masks similar to those used in lithographic process in the semiconductor industry. The masks include transparent substrates (e.g., quartz or glass), as well as a thin masking film such as chromium or other metals. Regions of the mask which include the masking film block light from reaching the sample, whereas regions of the mask which do not include the masking film allow the light to pass through and photosinter the ink films.

An example of a photosintering process that utilizes hard masks is shown in FIGS. 10A-10D. A copper nanoparticle ink film 1000 is first deposited on a substrate 1002. A mask 1004 then is positioned above the film 1000 and substrate 1002. The mask 1004 can include a transparent plate 1005 and metal patterns 1006 formed on the plate. The ink film 1000 then is selectively photosintered by exposing it to a light source through the mask 1004. The light source (not shown) can be a pulsed lamp that provides 2 J/cm energy density with a pulse width of less than 500 ms, and preferably less than 350 ms. Other light sources may be used as well. The photosintering may occur in air at ambient temperature and pressure or in an inert gas environment that includes gases such as hydrogen forming gas or nitrogen. After exposure, a layer of conducting film 1008 and non-conducting film 1010 remains on the substrate 1002 (see FIG. 10C). The non-conducting film 1010 then is removed (see FIG. 10D).

In general, nanoparticle ink films can be photosintered by exposing the films to light from the front side (i.e., the side on which the ink is deposited). In this manner, the light directly hits the ink without having to pass through a substrate. There are many advantages to this approach, especially when the substrate is absorbent to the light that is used. There are also cases in which it is advantageous to expose the deposited nanoparticle film from through the substrate to photosinter the ink. For example, in the case of a copper nanoparticle ink film on a Kapton® substrate, exposing the ink from the substrate backside can improve the adhesion between the nanoparticle film and the substrate because the layer of copper that absorbs the most light and reaches the highest temperature is near the surface of the Kapton® substrate. This is especially advantageous films in which the thickness is so great that the exposing light does not reach the interface layer between the nanoparticle film and the substrate. If the interface layer is not cured, then the adhesion will be very poor.

There is more and more interest to apply conductive conductors on flexible substrates, such as polyimide and polyethylene, etc., for applications in flexible display, smart packaging and low cost electronic tags. The primary methods for generating conductive patterns are screen printing for features larger than 100 μm and thin film and etching methods for features smaller than 100 μm. Inkjet printing of conductor is a promising approach to produce well-defined features. But, it is very difficult and costly for inkjet printing to achieve fine patterns below 50 μm. Inkjet printable conductive inks require low processing temperatures to allow deposition on organic substrates. A subsequent thermal treatment is normally required to achieve desired conductivity. For copper, an inert environment is necessarily required to prevent oxidation of copper when copper is thermally treated. The higher the temperature post-cure, the better the conductivity that can be achieved. This means that only thermally stable substrates can be used. The performance of the printed metal particles also varies significantly with substrate—in terms of conductivity, adhesion and uniformity. Inkjet is inherently a low viscosity technology and the content of metal by volume in a metal nanoparticle ink is therefore low. This effectively limits the speed of in-line printing since multiple passes may be required to deposit the necessary metal content. Finally, the nanoparticle approach is limited today mainly to silver since other metals require higher temperatures and/or inert atmospheres. The cost of these materials is relatively high for mass manufacturing applications. Thus much cheaper metal like copper has the potential for many applications where require cost-effective mass manufacturing is required.

Rapid optical curing, including pulsed laser with suitable wavelengths and short pulsed lamps, has been used to cure metal inks. Laser-direct writing technique may be used to pattern the metal films. But, due to small area of the laser beam, it is not possible to produce a well-defined pattern over a large area by directly using a hard mask. On the other hand, with a laser direct-writing method it is very difficult to achieve high through-put manufacturing. Short pulsed lamps, however, cannot only cure metal films over relative large area, but can also pattern metal films by using hard masks as has been extensively used for lithographic processes in semiconductor industries. But, normal lithographic process by using lamps is just to produce wanted patterns by exposing photo-resist.

Herein, high-energetic and short-pulsed optical lamps or lasers are used to cure metal inks at low temperature and pattern the metal ink with hard masks at the same time. This method has the potential to provide very fine patterns smaller than 50 μm by using the similar masks that have been used in lithographic processes in semiconductor industries. Most importantly, low-cost copper inks may be cured and patterned in air to produce conductive patterns for various applications, such as RFID (Radio-frequency identification) antennas.

Figure 23:
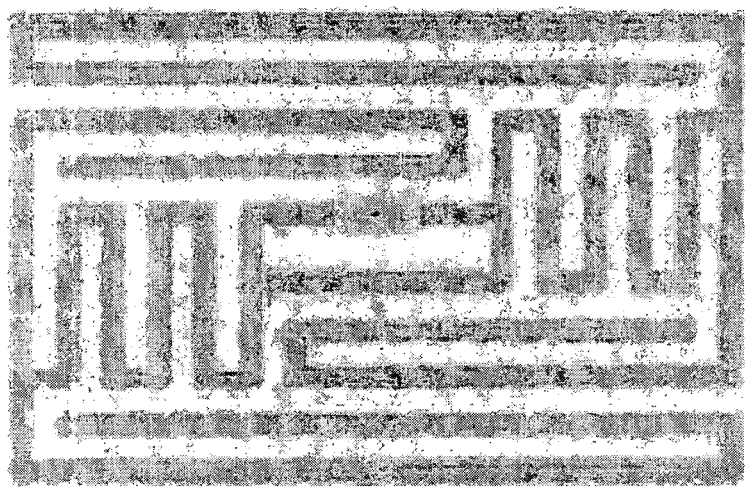
FIG. 23 illustrates an exemplary RFID antenna conductive pattern.

Metal ink, such as low-cost copper inks, may be deposited on polymer or paper substrates. Spray, draw-down, spin-casting, and other printing methods may be used to deposit the metal inks. After procure in air, the copper films, which are still insulating, will be ready for rapid optical curing. A mask with desired patterns, such as RFID antenna as shown in FIG. 23, can be used to obtain patterns as designed.

The non-cured areas, defined by the hard mask, normally have a very bad adhesion on substrates and insulating ($>2 \times 10^7 \Omega$), leaving the cured zones a very good adhesion and a high conductivity. The metal on the non-cured zones can be easily washed off by solvent or water and can also be collected and recycled for making new metal inks. Because the non-cured zones are insulating, these metal particles have no effects on patterned conductive patterns and thus can leave them on the substrates too.

Example 1. Curing Copper Inks on Polyimide Substrate

Copper inks are formulated for low cost deposition techniques, such as spray, draw-down, and spin-casting. The copper ink comprises copper nanoparticles, vehicle, and dispersants. The vehicle may be isopropyl alcohol (IPA), or toluene, or butylbenzene, or water, etc. An amine (e.g., hexylamine) is used as dispersant agent for copper nanoparticles. The size of copper nanoparticles ranges from 2 nm to 200 nm. The copper loading concentration can be from 10% to 50%. The loading concentration of dispersant agent can be from 1% to 30% in the ink. The copper ink is deposited on polyimide substrate by using draw-down process. The thickness of copper films before curing can be from 1 µm to 10 µm. The copper films are pre-cured in air at 100° C. for 30 minutes before optical curing. The films pre-cured are insulating and resistance over >2×10$^7$Ω.

A designed pattern on fused silica or quartz may be fabricated by the similar method that has been employed to make masks for lithographic process in semiconductor industries. An over 100 nm thick metal film, such as chrome, may be deposition on substrates that are transparent for light wavelength from near infrared to ultraviolet. The thickness of transparent substrates may be as thin as 0.2 mm or above, depending on how high the resolution will be for the pattern. The designed pattern may be fabricated by using lithographic tools and etching.

An optical system, employing high-power xenon lamps and delivering up to 2 J/cm energy density with a pulse width up to 350 milliseconds, is used to cure the copper inks, as described in FIGS. 10A-D. The optical curing may be done in air at room temperature. The curing process may also be carried out at low temperature and in inert environment if needed. The resistivity in the range ~10$^{-5}$ ohm-cm to 3×10$^{-6}$ ohm-cm may be achieved from the copper films after the optical curing. Non-volatile components of the films comprise less than 10% of the total amount. A repeat of the depositing and exposing steps creates multiple layers of the conductive film. The concentration of copper oxides in the cured film does not exceed 30%. The RFID antenna conductive pattern, described in FIG. 23, can be produced from the copper ink.

Figure 24A:
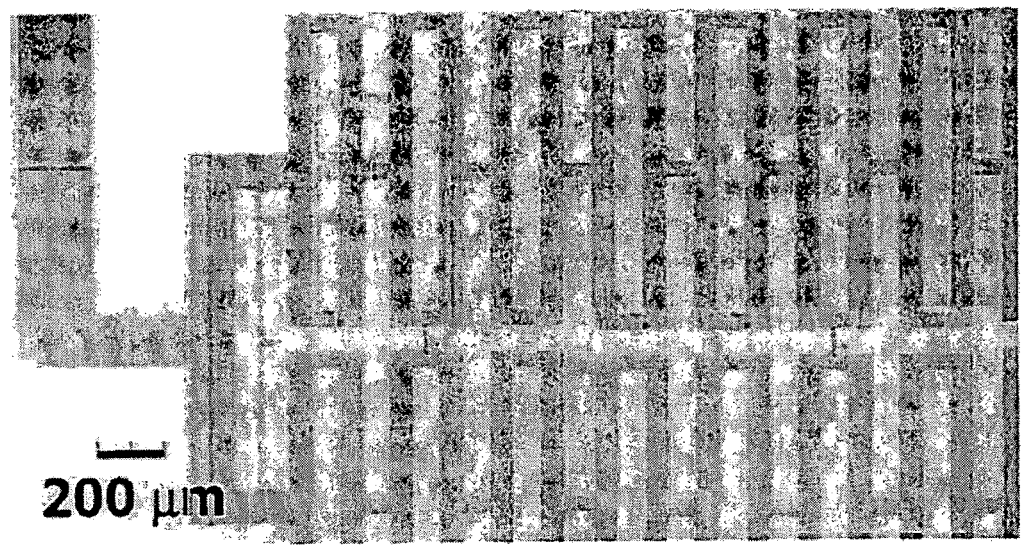
FIGS. 24(a) and (b) show how a photo-mask is used to pattern copper nanoparticles on a substrate.
Figure 24B:
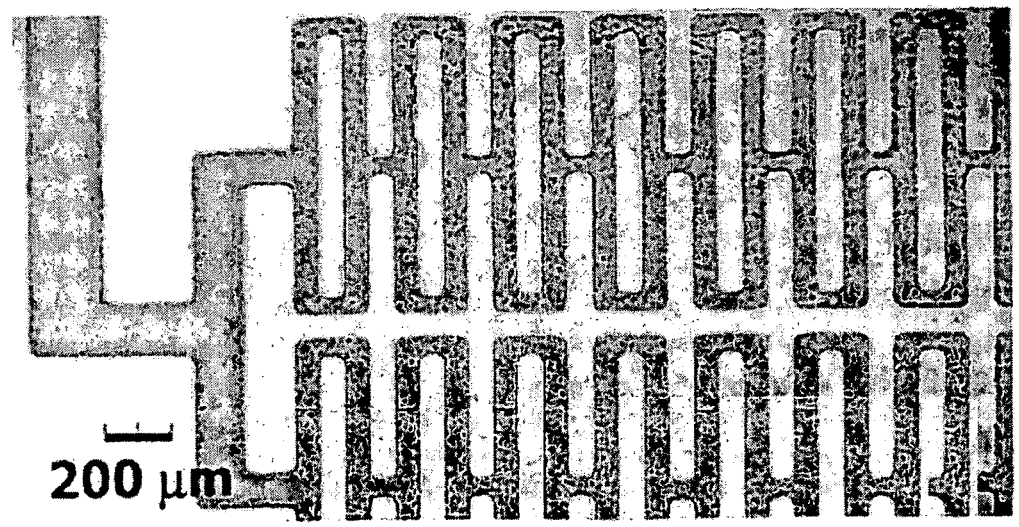

Example 2. Curing Copper Inks on Polyimide Substrate with Standard Photo-Mask FIG. 24(a) shows a standard photomask made on a quartz plate used in the semiconductor industry. The dark areas are the openings that allow high-energy light to pass through, and the rest of the areas are coated with a metallic film that reflects and absorbs received high-energy light. The high-energy light received through the openings of the photomask will selectively sinter the copper ink on the substrate and leave other areas of copper ink un-exposed by the high-energy light. The exposed areas of copper ink are fused and adhere to the polyimide substrate, and the un-exposed area has very weak adhesion on the substrate. FIG. 24(b) shows that, after the un-exposed areas of copper ink are removed by washing with water or other solvent, or simply with tape, an exact patterned copper film corresponding to the photomask is obtained achieving the same definition of copper traces that is defined by the used photomask. This demonstrates that the definition of copper pattern depends on the definition of photomask.

Micrometer or even sub-micrometer definition of copper traces may be achieved by using high definition photomasks.

Figure 25A:
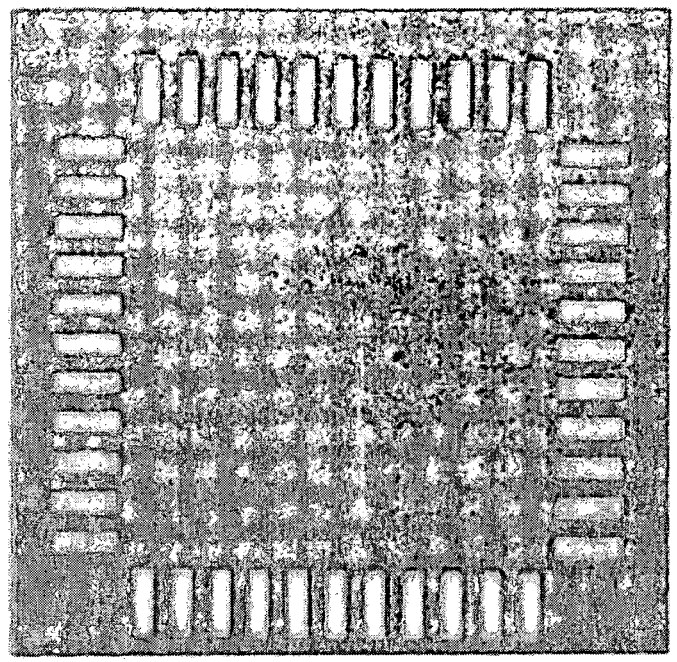
FIGS. 25(a) and (b) show how a shadow mask is used to pattern copper nanoparticles on a substrate.
Figure 25B:
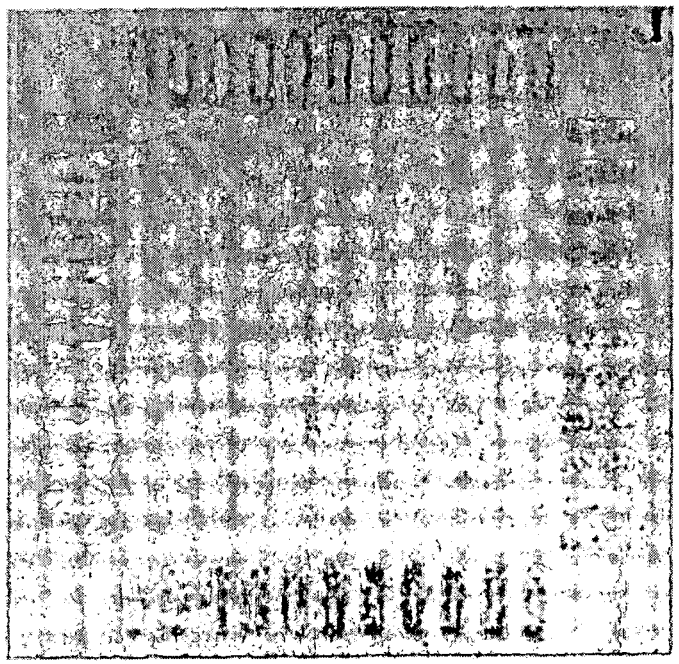

Example 3. Curing Copper Inks on Polyimide Substrate with Standard Photo-Mask FIG. 25(a) shows a shadow mask made from Kapton film. The white areas are openings of Kapton substrate, which allow high-energy light to pass through. The Kapton film can absorb some UV, visible and infrared light so that the passing light would not have enough energy to sinter nanoparticles, while the high-energy light passing through the openings has enough energy to sinter nanoparticles. FIG. 25(b) shows that, a patterned copper film corresponding to Kapton shadow mask is obtained after the un-sintered areas are removed by washing with water or solvent, or tape.

Nanoparticle ink formulations can include one or more vehicles (e.g., solvents) in which the nanoparticles are preserved. These include, for example, isopropyl alcohol (IPA), toluene, butylbenzene and water, among others. The ink formulations also can include dispersing agents to enhance the dispersion of the nanoparticles in the vehicles. An example of a dispersing agent is an amine (e.g., hexylamine). The nanoparticle size can range from 2 nm to 1000 nm in diameter. The concentration of nanoparticles in the solvent can range from 10% to 50%. The concentration of the dispersing agent can range from 1% to 30%.

As previously discussed, the presence of copper oxides tends to increase the resistivity of the nanoparticle films. There are a number of methods to remove or reduce the amount of copper oxides. These techniques typically entail removal of the oxides from the nanoparticles prior to formulating the ink solution. For example, copper oxides can be removed by applying solutions of ascorbic acid or ethylenediamine to the copper nanoparticles. The ascorbic or ethylenediamine solutions reduce the copper oxides to copper. Once the oxides have been removed, the nanoparticles can be added to the ink solvent. The nanoparticles may be added in an inert environment, such as forming gas, nitrogen or argon, to avoid the reformation of oxides on the nanoparticles. In some cases, the nanoparticles can be encapsulated to avoid oxide formation during the thermal curing or photosintering process. Such an encapsulation material is NanoSal™, a proprietary material consisting of solid nanospheres available from Salvona Technologies. In some cases, the ink formulation can include material that will remove the oxides from the nanoparticles, in situ. Such a compound is glyoxylic acid.

In some implementations, the oxides can be removed using solutions that are incorporated into the ink formulation. For instance, some ink formulations can include glyoxylic acid to remove the copper oxides. The copper nanoparticles are first added to the glyoxylic acid which removes at least a portion of the copper oxide present on the nanoparticles. The nanoparticle-acid solution then is added to a solution containing water and/or IPA to provide the ink formulation. Remaining copper oxide further can be removed using sonication of the ink formulation. The solution then is drop-deposited or printed onto a substrate and dried.

Table 1 below shows XRD data indicating the reduction in copper oxide content for a glyoxylic treated nanoparticle film that was dried in air and for another glyoxylic treated film that was dried in a 60° C. oven for 1 hour. The table also includes data for a nanoparticle film that was not treated with glyoxylic acid. The ink formulations included 20-40 nm copper nanoparticles. The glyoxylic acid solution included 1 gram copper, four milliliters of water and 0.1 grams glyoxylic acid. As can be seen from the table, the relative ratio of $Cu_2O$ to copper in height and in area of the XRD peaks is low for glyoxylic acid treated films which are oven dried at 60° C. for 1 hour.

TABLE 1

| Copper Nanoparticles (NPs) | Solution | | $Cu_2O$:Cu (Height) | $Cu_2O$:Cu (area) |
|---|---|---|---|---|
| 20-40 nm nanoparticle ink formulation | | | 1:5.2 (16% $Cu_2O$) | 1:2 (34% $Cu_2O$) |
| 20-40 nm nanoparticle ink formulation treated with Glyoxylic acid (GA) | 1 g Cu NPs + 4 ml Water + 0.1 g GA | Air dry | 1:11 (8% $Cu_2O$) | 1:5 (17% $Cu_2O$) |
| | | Oven air-dry at 60° C. @ 1 hour | 1:29 (3% $Cu_2O$) | 1:12 (8% $Cu_2O$) |

Microfabrication using a pulsed laser beam is attracting considerable attention for its ability to make two or three-dimension (2-D or 3-D) microstructures with close to 100 nm resolution (S. Maruo, O, Nakamura and S. Kawata, "Three-dimensional microfabrication with two-photon absorbed photopolymerization," Opt. Lett. 22, 132-134 (1997); S. Maruo, H. B. Sun, T. Tannaka and S. Kawata, "Finer features for functional devices," Nature 412, 697-698 (2001)). However, since 2-D and 3-D microstructures made of photopolymers are non-conductive, their use in microelectronic devices, and MEMs (Micro-electromechanical systems) is limited. To overcome this limitation, some groups have studied 3-D direct writing of metallic microstructures employing two-photon processes (T. Tannaka, A. Ishikawa and S. Kawata, "Two-photon-induced reduction of metal ions for fabricating three-dimension electrically conductive metallic microstructure," Appl. Phys. Lett. 88,081107 (2006)). These methods are based on the photo-reduction of metallic ions such as silver and gold. Other groups have used polymeric films containing metal ions for making metallic microstructures (T. Baldacchini, A. C. Pons, et al., "Multiphoton laser direct writing of two dimensional silver structures," Opt. Express 13, 1275-1280 (2005)). These methods cannot produce highly conductive conductors due to the remaining polymeric matrix or residues after fabrication. Copper is a widely applied electronic material and it is much cheaper than silver and gold. As the density of semiconductor devices increases and the size of circuit elements becomes smaller to achieve better performance, resistance capacitance (RC) delay time in back-end-of-line (BEOL) increases and dominates circuit performance. Copper interconnection has been adapted to silicon integrated circuits due to its low resistance compared to traditional aluminum interconnection. Copper also has high electromigration resistance that other metals like silver do not have, making it the best choice for interconnections in semiconductor industry.

Electroplated copper, chemical etched copper, and physical and chemical vapor deposited copper are the most extensively used in electronic industries. Photolithographic processing is normally required to produce the designed copper traces. Laser induced deposition of copper is known as a promising technique for rapid fabricating and repairing conductive tracks and circuits. Advantages of laser-direct writing technique as follows, making it a high throughput and low-cost fabrication of conductive copper microstructures:

1) Direct writing of highly conductive micro-structures does not require any photolithographic processing. The remaining un-treated materials can be easily stripped off.
2) No seed layer is needed, which is extensively used for electroplated copper.
3) This additive micro-lithography technique is inexpensive (no photolithography needed) and high throughput. Micro and submicro-structures can be fabricated directly on expected locations by using high-speed positioning system and scanning laser beam in atmosphere.
4) Conductive 3-D microstructures can be built up with a layer-by-layer process without using any photolithographic processing.

In laser writing or photosintering by using masks, various ink precursor chemistries are chosen according to the requirements of the device of interest (D. S. Ginley et al., Electrochemical and Solid-State Letters, 4 (8), C58 (2001)). Copper nano-inks are sintered for plastic substrates with excellent adhesion using a photo-sintering system having micro-second pulse duration of a short high intensity light pulse. Copper films with a mirror-smooth surface, very low content of organic residue, excellent adhesion, and low resistivity (close to bulk copper), are achieved on flexible substrates using this micro-second pulsed lamp in air and at room temperature. This process can sinter copper nano-inks over large area with one single pulse, to produce copper traces with low resolution, and it is suitable for roll-to-roll cost-effective manufacturing on flexible substrates. With this relatively long pulse, it is very difficult to achieve good adhesion and enough pulsed energy to photo-sinter copper nanoparticles on silicon substrates, however. The reasons are that inorganic substrates, like silicon, have much higher thermal conductivity and melting point. With a long pulse of light, the percentage of thermal heat converted from high density photons transferring to substrate and ambient is much higher than using a shorter pulsed light. With an ultrashort laser system, it will be able to achieve fully sintering of copper nanoparticles and to obtain good adhesion on silicon. Additionally, the ultrashort pulse laser may also have more effective photoreduction of copper oxides into metallic copper without re-oxidation due to the ultrashort duration of sintering process. Nanosecond laser and even femtosecond laser will result in much higher temperatures for sintering of nanoparticles, and has the less chance to re-oxide and produce micro-feature copper traces.

The technologies engaged with TSV chip connection include TSV formation, insulator/barrier/seed deposition, via copper filling process, surface copper removal, wafer thinning, inspection, test, etc. Process robustness and speed of copper deposition are among the most important technologies to realize STV chip integration. Right now, electroplated copper is the leading choice to fill the vias. There are generally three types of via filling processes; lining along the sidewall of vias, full filling within vias, and full filling with stud formation above the vias (B. Kim and T. Ritzdorf, SEMI Technology Symposium (STS) Proceedings, Semicon Korea, p. 269 (2006)). Various through-silicon via (TSV) integration schemes can be classified by when the vias are created in the manufacturing process. Normally, a via or hole is etched through the silicon using a deep reactive ion etching process. This hole is then lined with a dielectric sleeve deposited by CVD technique. Then, a diffusion barrier and copper seed layer is deposited by physical vapor deposition (PVD), and the hole is filled by electroplated copper. There are several main drawbacks for using electroplating copper to fill the vias:

1) With an electroplating process, it may take long time to fill the vias with a high aspect ratio.
2) PVD equipment for the deposition of a barrier/seed layer for copper electroplating have to be developed to have uniform coating in high-aspect-ratio vias.
3) The chemicals and additives need to be improved to fill vias. Consumption of chemical additives is also critical.
4) Photolithographic processing is needed to make copper traces.

Filling via openings on the range of 10-40 µm, 50-100 µm deep, spacing of 20-50 µm, is currently being pursued by the semiconductor industry. Smaller features may be required too. Currently, the main challenges with TSV technology are how to make this cost effectively with high productivity, fill the vias without voids and get good electrical results.

By using low viscosity copper nano-inks, vias can be filled by inkjet printing or dip-deposition. After pre-cure at 100° C. in air, the nanoparticles will then be sintered by pulsed laser beam or high energy flash lamps with masks. With scanning system and multilayer deposition, the laser-sintered or photosintered copper 3-D microstructures can be fabricated to fill the vias in air at room temperature. No seed layer is needed to deposit in the vias. This method is straightforward, fast and conserving in the use of expensive material by only depositing material at desired places on the substrate whereas the conventional method, lithography, applies a metal coating over the entire substrate and removes the undesired layer by chemical etching producing highly toxic waste. Thus this laser-induced conductive micro-structuring provides a cost-effective and high throughput technique for the electronic industry.

Figure 22:
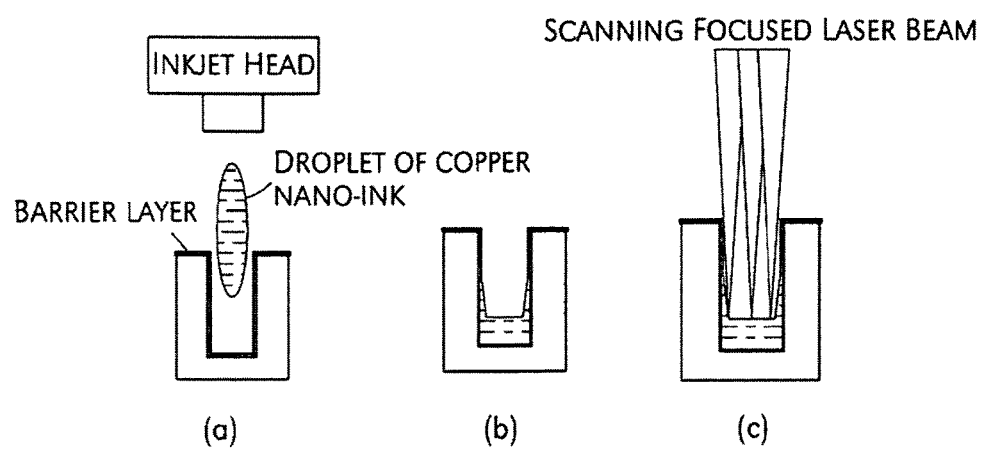
FIG. 22 illustrates a process for filling copper nano-inks into vias and sintering copper nanoparticles by a high-speed positioning and scanning focused laser.

FIG. 22 shows the process of filling copper nano-inks into vias and sintering copper nanoparticles by high-speed positioning and scanning focused laser, providing a high throughput and low cost manufacturing 2-D or 3-D conductive micro-structures. In step (a), inkjet or dip deposition can be used to fill copper nano-ink into vias. In step (b), dry and remove solvent in the ink. In step (c), combine a high speed positioning system and scanning laser beam or high energy flash lamps by employing masks; the copper ink will be sintered in a very short time and adhere to the substrate. Unsintered copper ink can be easily stripped off due to bad adhesion.

There are millions of copper micro-traces for interconnections in one single chip, which will be very time consuming for laser direct writing to fabricate. "Damascene electroplated copper" currently dominates in this field. The number of TSV between the chips is very limited. Thus, laser sintering nanoparticles for 3-D packaging is a feasible technique to fulfill the high throughput and low cost manufacturing demands once commercially available high speed and high accuracy positioning systems are combined.

In some implementations, the nanoparticle ink formulations can be used to form devices other than conductive patterns on planar substrates. For example, the nanoparticle ink formulations can be used to provide metal coated fibers. Metal coated fibers, such as nickel and copper coated fibers, are typically used in the carbon composites or metal composites industry to provide high strength and electrically conductive materials. However, to form the metal coated fibers by electro-deposition, the fibers are generally required to be electrically conducting. Although carbon fibers may be electrically conducting to some degree, other fibers, such as nylon, Kapton®, Kevlar® and other polymer-based materials, are non-conducting. Accordingly, it is difficult to perform electrodeposition on those fibers.

To coat both electrically conducting and non-conducting fibers with metal, the fibers can be immersed in nanoparticle ink formulations that contain nickel, chromium, copper and/or other metal nanoparticles. After the ink is dried to remove the solvent, the fibers can be exposed to a light source for photosintering. Depending on the ink formulation, the light power will vary. As previously explained, the metal nanoparticles will fuse during the photosintering step to provide a highly conductive metal coating that adheres to the fiber. In some cases, the process can be completed in a batch process as shown in the example of FIG. 11.

Figure 11:
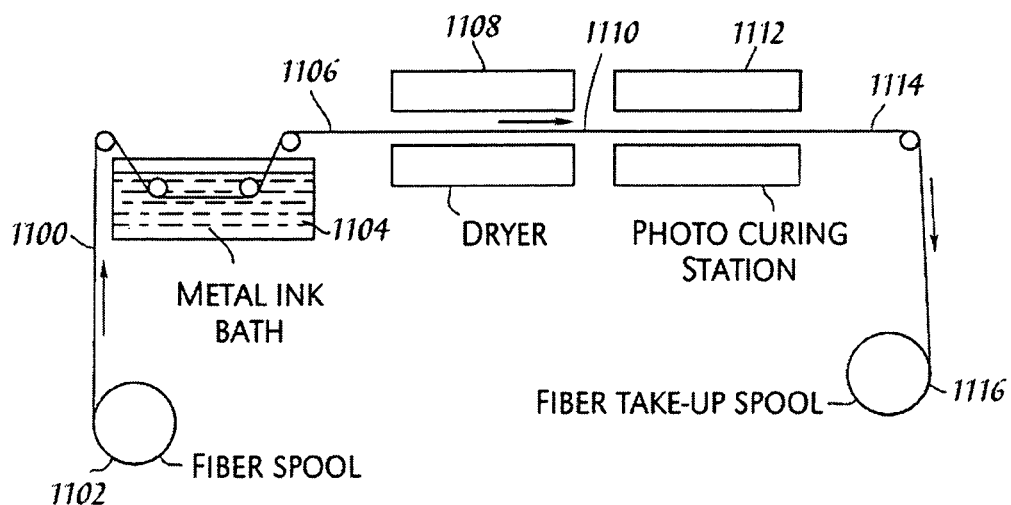
FIG. 11 illustrates a roll-to-roll process of coating a fiber.

FIG. 11 illustrates a roll-to-roll process of coating a fiber using a metal ink and photosintering. A fiber 1100 is dispensed from a spool 1102 and then taken into an ink bath 1104. Other methods, such as spraying, also may be used to coat the ink onto the fiber. In addition, methods may be used that coat less than the entire circumference of the fiber. The coated fiber 1106 then is passed through a drier 1108 to remove water and/or solvents from the ink. The dried and ink-coated fiber 1110 then is passed through a photosintering station 1112. The station 1112 can include a series of flash lamps that are activated for short periods of time to expose the ink-coated fiber. The timing of the lamp activation can be arranged so that no portion of the fiber is exposed more than once. Additionally, the station 1112 can be arranged to expose and cure less than the entire circumference of the fiber 1110. The photosintered fiber 1114 then is rolled up by a fiber take-up spool 1116. Alternatively, the fiber 1114 can be cut into sections and stacked. This process can work with individual fibers or fiber bundles.

A number of embodiments of the invention have been described. Nevertheless, it will be understood that various modifications may be made without departing from the spirit and scope of the invention. Other embodiments are within the scope of the following claims.

A similar process can also be applied to short fibers or chopped fiber. The fibers can be mixed with a metal particle ink and then the fibers removed from the solution and dried. They could be put on a moving surface either before or after drying. The surface can be moved through a photosintering station, then collected and packaged or sent to further processing steps. The moving surface may also be transparent to allow light to pass through.

What is claimed is:
1. A method of forming a conductive layer comprising:
  depositing a film containing a plurality of copper nanoparticle structures on a surface of a substrate;
  exposing at least a portion of the film to light to make the exposed portion conductive, so as to form the conductive layer, wherein the exposing at least a portion of the film photosinters at least a portion of the copper nano- particle structures, wherein the photosintering of copper nanoparticle structures comprises a photoreduction of CuO and $Cu_2O$ in the copper nanoparticle structures to Cu;

wherein the film is exposed to the light through a backside of the substrate which further fuses the copper nanoparticle structures with the substrate.

2. A method of forming a conductive layer comprising:

depositing a film containing a plurality of copper nanoparticle structures on a surface of a substrate;

exposing at least a portion of the film to light to make the exposed portion conductive, so as to form the conductive layer, wherein the exposing at least a portion of the film photosinters at least a portion of the copper nanoparticle structures, wherein the photosintering of copper nanoparticle structures comprises a photoreduction of CuO and $Cu_2O$ in the copper nanoparticle structures to Cu;

wherein the film has a viscosity in a range of 8-20 centipoise, and a surface tension in a range of 20-60 $dyne/cm^2$.

3. A method of forming a conductive layer comprising:

depositing a film containing a plurality of copper nanoparticle structures on a surface of a substrate; and exposing at least a portion of the film to light to make the exposed portion conductive, so as to form the conductive layer, wherein the exposing at least a portion of the film to light causes at least a portion of the copper nanoparticle structures to fuse together, wherein copper oxides in the copper nanoparticle structures are reduced during the fusion, wherein a loading concentration of copper oxides in the fused film does not exceed 30%, wherein the fused film has a resistivity in a range of about $10^{-5}$ ohm-cm to $3 \times 10^{-6}$ ohm-cm.

4. A method of forming a conductive layer comprising:

depositing a film containing a plurality of copper nanoparticle structures on a surface of a substrate;

exposing at least a portion of the film to light to make the exposed portion conductive, so as to form the conductive layer, wherein the exposing at least a portion of the film photosinters at least a portion of the copper nanoparticle structures, wherein the photosintering of copper nanoparticle structures comprises a photoreduction of CuO and $Cu_2O$ in the copper nanoparticle structures to Cu;

wherein, before the exposing of at least a portion of the film, the film is non-conductive and is deposited from a solution containing the copper nanoparticle structures; and wherein the solution comprises hexylamine.

5. A method of forming a conductive layer comprising:

depositing a film containing a plurality of copper nanoparticle structures on a surface of a substrate;

exposing at least a portion of the film to light to make the exposed portion conductive, so as to form the conductive layer, wherein the exposing at least a portion of the film photosinters at least a portion of the copper nanoparticle structures, wherein the photosintering of copper nanoparticle structures comprises a photoreduction of CuO and $Cu_2O$ in the copper nanoparticle structures to Cu;

wherein, before the exposing of at least a portion of the film, the film is non-conductive and is deposited from a solution containing the copper nanoparticle structures, comprising adding the copper nanoparticle structures to a solvent to form the solution prior to depositing the film; and adding a dispersant to the solution;

wherein a loading concentration of the copper nanoparticle structures in the solution is about 10%-50%, and wherein the dispersant comprises hexylamine in a loading concentration in the solution of about 1%-30%, wherein the deposited film is dried in air at about 100° C., wherein after the photosintering, the portion of the film has a resistivity in a range of about $10^{-5}$ ohm-cm to $3 \times 10^{-6}$ ohm-cm.

\* \* \* \* \*